US009960268B2

(12) United States Patent
Zundel et al.

(10) Patent No.: US 9,960,268 B2
(45) Date of Patent: May 1, 2018

(54) SEMICONDUCTOR DEVICES, POWER SEMICONDUCTOR DEVICES, AND METHODS FOR FORMING A SEMICONDUCTOR DEVICE

(71) Applicant: Infineon Technologies AG, Neubiberg (DE)

(72) Inventors: Markus Zundel, Egmating (DE); Christian Kampen, Munich (DE); Jacob Tillmann Ludwig, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/288,243

(22) Filed: Oct. 7, 2016

(65) Prior Publication Data
US 2017/0110572 A1   Apr. 20, 2017

(30) Foreign Application Priority Data

Oct. 15, 2015  (DE) .......................... 10 2015 117 578
Sep. 29, 2016  (DE) .......................... 10 2016 118 543

(51) Int. Cl.
*H01L 29/78*   (2006.01)
*H01L 29/66*   (2006.01)
(Continued)

(52) U.S. Cl.
CPC ...... *H01L 29/7813* (2013.01); *H01L 29/0878* (2013.01); *H01L 29/1095* (2013.01);
(Continued)

(58) Field of Classification Search
CPC ............... H01L 29/7813; H01L 29/404; H01L 29/4236; H01L 29/1095; H01L 29/0878; H01L 29/66734
(Continued)

(56) References Cited

U.S. PATENT DOCUMENTS 5,637,898 A   6/1997  Baliga
6,365,462 B2  4/2002  Baliga
(Continued)

FOREIGN PATENT DOCUMENTS

DE   102007014038 A1   9/2008
DE   102007037858 B4   4/2012

*Primary Examiner* — Dao H Nguyen
(74) *Attorney, Agent, or Firm* — Murphy, Bilak & Homiller, PLLC

(57) ABSTRACT

A semiconductor device includes a drift region of a device structure arranged in a semiconductor layer. The drift region includes at least one first drift region portion and at least one second drift region portion. A majority of dopants within the first drift region portion are a first species of dopants having a diffusivity less than a diffusivity of phosphor within the semiconductor layer. Further, a majority of dopants within the second drift region portion are a second species of dopants. Additionally, the semiconductor device includes a trench extending from a surface of the semiconductor layer into the semiconductor layer. A vertical distance of a border between the first drift region portion and the second drift region portion to the surface of the semiconductor layer is larger than 0.5 times a maximal depth of the trench and less than 1.5 times the maximal depth of the trench.

23 Claims, 13 Drawing Sheets

(51) Int. Cl.
*H01L 29/423* (2006.01)
*H01L 29/10* (2006.01)
*H01L 29/08* (2006.01)
*H01L 29/40* (2006.01)

(52) U.S. Cl.
CPC ........ *H01L 29/404* (2013.01); *H01L 29/4236* (2013.01); *H01L 29/66734* (2013.01)

(58) Field of Classification Search
USPC .......... 257/285, 328, 330, 332, 334, E29.02, 257/E29.066, E29.262, E21.41, E21.211, 257/E21.616, E27.06, E27.091; 438/270, 438/495, 508
See application file for complete search history.

(56) References Cited

U.S. PATENT DOCUMENTS

| | | | |
|---|---|---|---|
| 6,388,286 B1 | 5/2002 | Baliga | |
| 2004/0178444 A1* | 9/2004 | Blanchard | H01L 29/7813 257/328 |
| 2011/0241111 A1* | 10/2011 | Tamaki | H01L 29/0634 257/342 |
| 2012/0267707 A1* | 10/2012 | Sasaki | H01L 29/0634 257/329 |
| 2015/0097237 A1* | 4/2015 | Tamaki | H01L 29/66681 257/339 |
| 2015/0118810 A1* | 4/2015 | Bobde | H01L 29/7813 438/270 |

* cited by examiner

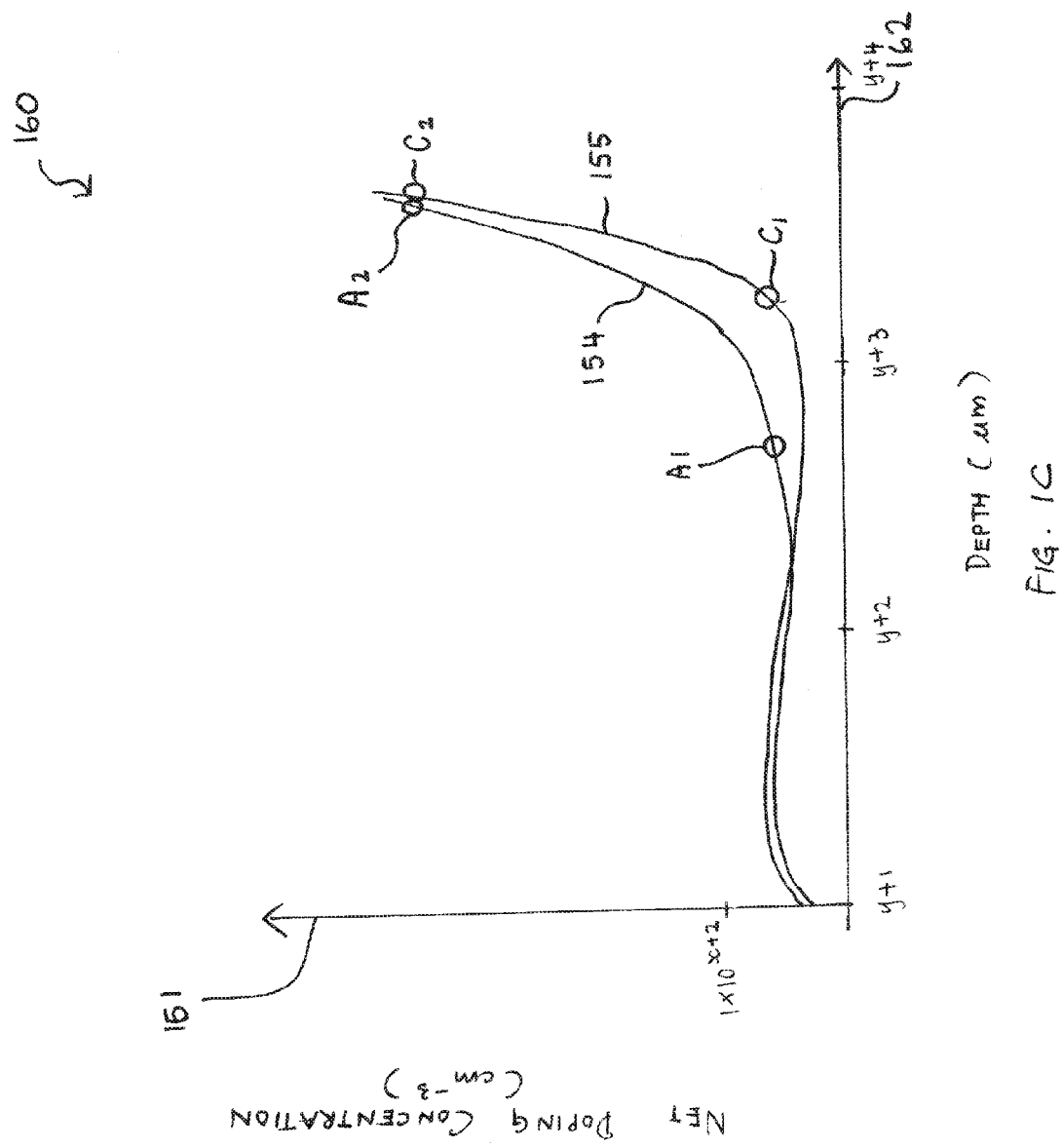

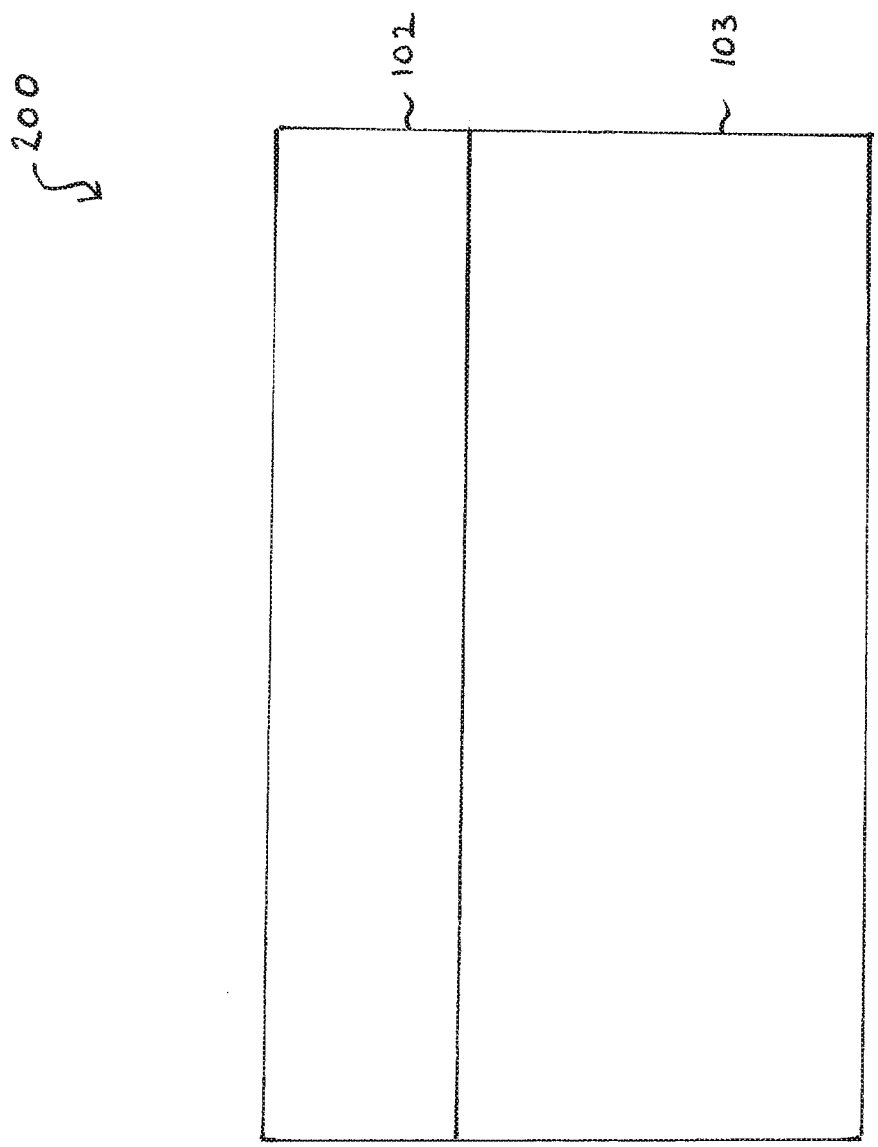

SEMICONDUCTOR DEVICES, POWER SEMICONDUCTOR DEVICES, AND METHODS FOR FORMING A SEMICONDUCTOR DEVICE

TECHNICAL FIELD

Embodiments relate to concepts for semiconductor device structures, and in particular to semiconductor devices, power semiconductor devices, and methods for forming a semiconductor device.

BACKGROUND

New generations of semiconductor devices (e.g. power devices) may have to be optimized with respect to costs. High doping levels in power semiconductor devices may lead to strong diffusion out of semiconductor doping regions and to flat and wide diffusion profiles. These may lead to increased turn-on resistance of the devices, and/or reduced robustness against avalanche conditions, for example.

SUMMARY

It is a demand to provide concepts for semiconductor devices with improved robustness and/or improved device characteristics.

Such a demand may be satisfied by the subject matter of the claims.

Some embodiments relate to a semiconductor device including adrift region of a device structure arranged in a semiconductor layer. The drift region includes at least one first drift region portion and at least one second drift region portion. A majority of dopants within the first drift region portion are a first species of dopants having a diffusivity less than a diffusivity of phosphor within the semiconductor layer. Further, a majority of dopants within the second drift region portion are a second species of dopants. Additionally, the semiconductor device includes a trench extending from a surface of the semiconductor layer into the semiconductor layer. A vertical distance between the surface of the semiconductor layer and a border between the first drift region portion and the second drift region portion is larger than 0.5 times a maximal depth of the trench and less than 1.5 times the maximal depth of the trench.

Some embodiments relate to a semiconductor device. The semiconductor device comprises a drift region of a device structure arranged in a semiconductor layer located adjacently to a semiconductor substrate. A doping concentration at a transition from the drift region to the semiconductor substrate varies between a first doping concentration value and a second doping concentration value over a distance of less than 500 nm. The first doping concentration value is an average net doping concentration of a mid-portion of the drift region plus 20% of the average net doping concentration of the mid-portion of the drift region. The mid-portion of the drift region lies within a middle 50% of a vertical dimension of the drift region. The second doping concentration value is an average net doping concentration of the mid-portion of the drift region plus one decade.

Some embodiments relate to a power semiconductor device. The power semiconductor device comprises an epitaxial semiconductor layer located adjacently to a semiconductor substrate. The epitaxial semiconductor layer is doped with doping atoms having a diffusivity less than phosphorus in the epitaxial semiconductor layer. The semiconductor substrate is doped with doping atoms having diffusivity less than phosphorus in the semiconductor substrate.

Some embodiments relate to a method for forming a semiconductor device. The method comprises epitaxially growing a first epitaxial semiconductor sub layer of a semiconductor layer. A majority of dopants within the first epitaxial semiconductor sub layer are dopants having a diffusivity less than a diffusivity of phosphor within the semiconductor layer. Further, the method comprises epitaxially growing a second epitaxial semiconductor sub layer of a semiconductor layer after forming the first epitaxial semiconductor sub layer. A majority of dopants within the second epitaxial semiconductor sub layer are phosphor atoms. Additionally, the method comprises forming a trench extending from a surface of the semiconductor layer into the semiconductor layer. A vertical distance of a border between the first epitaxial semiconductor sub layer and the second epitaxial semiconductor sub layer to the surface of the semiconductor layer is larger than 0.5 times a maximal depth of the trench and less than 1.5 times the maximal depth of the trench.

Some embodiments relate to a method for forming a semiconductor device. The method comprises forming a semiconductor layer on a semiconductor substrate. The semiconductor substrate comprises a doping of doping atoms having a diffusivity less than a diffusivity of phosphorus. The method further comprises incorporating doping atoms having a diffusivity less than a diffusivity of phosphorus into the semiconductor layer to form a drift region of a device structure in the semiconductor layer during or after the forming of the semiconductor layer.

BRIEF DESCRIPTION OF THE FIGURES

Some embodiments of apparatuses and/or methods will be described in the following by way of example only, and with reference to the accompanying figures, in which

FIGS. 1B and 1C show graphical illustrations of a variation of average net doping concentration (per $cm^3$) with respect to dopant depth (μm).

FIG. 2A shows a schematic illustration of a semiconductor device;

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in alike fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "and" "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having meaning the is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1A:
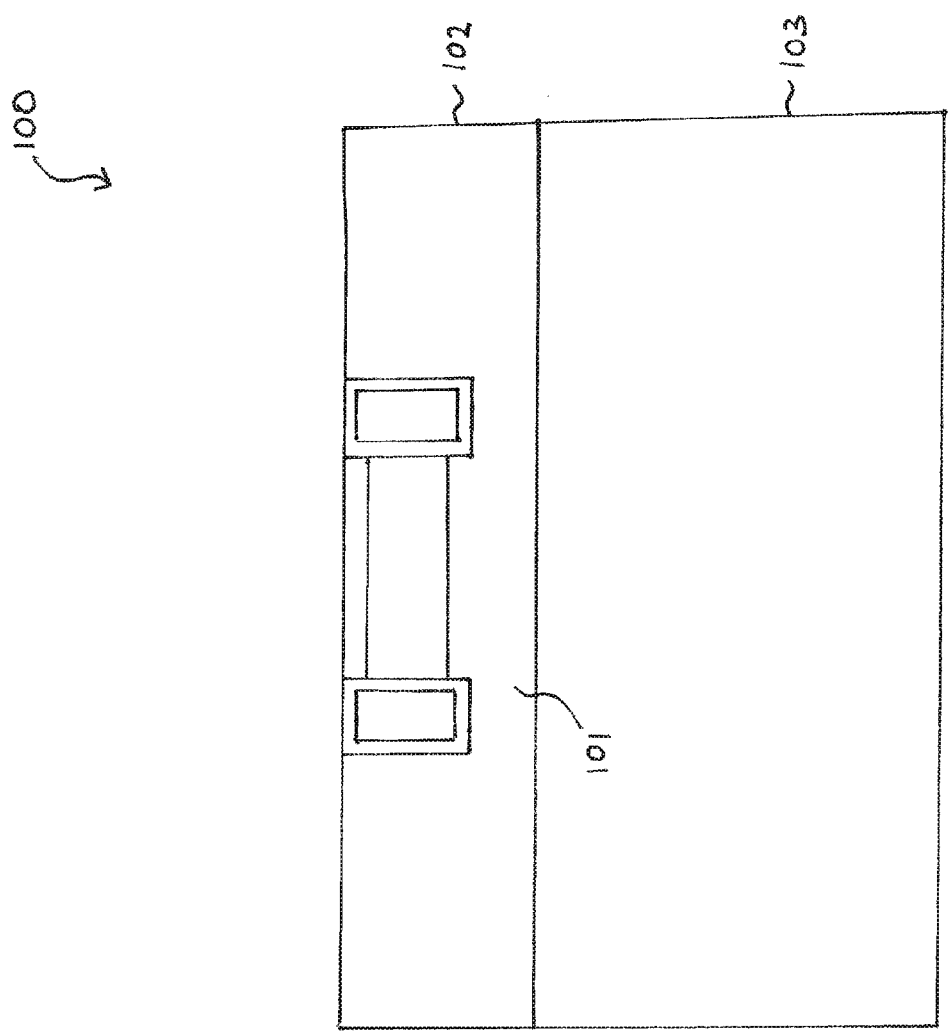
FIG. 1A shows a schematic illustration of a semiconductor device.

FIG. 1A shows a schematic illustration of a semiconductor device 100 according to an embodiment.

The semiconductor device 100 comprises a drift region 101 of a device structure arranged in a semiconductor layer 102 located adjacently to a semiconductor substrate 103.

A doping concentration at a transition from the drift region 101 to the semiconductor substrate 103 varies between a first doping concentration value and a second doping concentration value over a distance of less than 500 nm.

The first doping concentration value is an average net doping concentration of a mid-portion of the drift region plus 20% of the average net doping concentration of the mid-portion of the drift region.

The mid-portion of the drift region 101 lies within a middle 50% of a vertical dimension of the drift region 101.

The second doping concentration value is an average net doping concentration of the mid-portion of the drift region plus one decade.

Due to the doping concentration at the transition from the drift region 101 to the semiconductor substrate 103 varying between the first doping concentration value and the second doping concentration value over a distance of less than 500 nm, a turn-on resistance of the semiconductor device may be reduced and/or avalanche robustness of the semiconductor device may be improved.

The transition from the drift region to the semiconductor substrate may be a region at an interface at which the drift region of the device structure and the semiconductor substrate meet. For example, the transition from the drift region to the semiconductor substrate may refer to a region including a meeting interface (or surface) between the drift region and the semiconductor substrate, and/or at least part of the drift region (e.g. not more than 50% or 25% of the entire drift region) directly adjacent to the meeting surface, and/or at least part of the semiconductor substrate (not more than 50% or 25% of the entire semiconductor substrate) directly adjacent to the meeting interface.

The drift region 101 may extend vertically (e.g. substantially perpendicularly or orthogonally) from a body region of field effect transistor or insulated gate bipolar transistor or from an anode/cathode region of a diode towards (or to) the semiconductor substrate 103, for example. The mid-portion of the drift region 101 (from which the average net doping concentration value is derived) lies within a middle 50% (or e.g. within a middle 40%, or e.g. within a middle 30%) of a vertical extension of the drift region 101. The middle 50% portion of the drift region 101 may refer to a portion of the drift region between a first interface region of the drift region and a second interface region of the drift region separated from the first interface region by a minimum vertical dimension (extension) or vertical separation distance. The first interface region of the drift region 101 may be a boundary between (or transition from) the drift region 101 and the body region or anode/cathode region of the device structure, for example. The second interface region of the drift region 101 may be a boundary between (or transition from) the drift region 101 and the semiconductor substrate 103, for example.

The mid-portion of the drift region 101 may have an minimum vertical dimension of 50% of the vertical dimension between the first interface region and the second interface region, for example, and which may be a region of the drift region 101 equidistant from the first interface region and the second interface region. For example, for a drift region having a minimum vertical dimension of 4 μm between the first interface region and the second interface region, the middle 50% portion may be a region having a minimum vertical dimension of 2 μm, and may have a separation distance of 1 μm from the first interface region, and a separation distance of 1 μm from the second interface region.

The first doping concentration value is an average net doping concentration of the mid-portion of the drift region 101 plus 20% (or e.g. plus 25%) of the average net doping concentration of the mid-portion of the drift region 101. For example, if the average net doping concentration value of the mid-portion of the drift region 101 is $1*10^{16}$ doping atoms per $cm^3$, the first doping concentration value is $1.2*10^{16}$ (or $1.25*10^{16}$) doping atoms per cm$^3$. The average net doping concentration value of the mid-portion of the drift region 101 may be at least $1*10^{16}$ doping atoms per cm$^3$ (or e.g. at least $1*10^{17}$ m doping atoms per cm$^3$, or e.g. may lie between $1*10^{16}$ doping atoms per cm$^3$ and $1*10^{17}$ doping atoms per cm$^3$). The average net doping concentration of the mid-portion of the drift region 101 may be a measured number of dopant atoms per volume averaged over the mid-portion of the drift region 101 of the device structure, for example.

The second doping concentration value is an average net doping concentration of the mid-portion of the drift region plus one decade. In other words, second doping concentration value is one order of magnitude (or e.g. 10 times) higher than the average net doping concentration of the mid-portion of the drift region on a logarithmic scale. For example, if the average net doping concentration value of the mid-portion of the drift region 101 is $1*10^{16}$ doping atoms per cm$^3$, the second doping concentration value is $1*10^{17}$ doping atoms per cm$^3$, and the first doping concentration value is $1.2*10^{16}$ doping atoms per cm$^3$.

The doping concentration at the transition from the drift region to the semiconductor substrate varies between the first doping concentration value and the second doping concentration value over a distance of less than 500 nm (or e.g. less than 400 nm, or e.g. less than 300 nm, or e.g. less than 200 nm). For example, the doping concentration at the transition from the drift region 101 to the semiconductor substrate 103 may vary from $1.2*10^{16}$ doping atoms per cm$^3$ to $1*10^{17}$ doping atoms per cm$^3$ over a distance of less than 500 nm in the case of the above example.

For example, the doping concentration at the transition from the drift region to the semiconductor substrate may increase from the first doping concentration value to the second doping concentration value over a distance of more than 100 nm (or more than 50 nm or more than 150 nm). Although a very steep increase may be desired, at least some slope will exist due to diffusion of dopants, for example.

The semiconductor layer 102 may be grown epitaxially on a surface of the semiconductor substrate 103. For example, the semiconductor layer 102 may be grown epitaxially on a front side facing surface of the semiconductor substrate 103, such that the epitaxially grown semiconductor layer 102 is arranged on the surface of the semiconductor substrate 103. The semiconductor layer 102 may have a minimum (or smallest) thickness of less than 8 μm (or e.g. less than 6 μm, or e.g. less than e.g. less than 4 μm) measured in a substantially vertical direction (or perpendicular to the surface of the semiconductor substrate 103). The semiconductor layer 102 may extend laterally over the front side facing surface of the semiconductor substrate 103, for example. The semiconductor layer 102 may extend vertically (e.g. substantially perpendicularly or orthogonally) from a surface of the semiconductor layer 102 adjacent to metal layers, insulation layers and/or passivation layers towards the front side facing surface of the semiconductor substrate 103, for example.

The drift region 101 may be formed in the semiconductor layer 102 by doping the semiconductor layer 102. The drift region 101 of the semiconductor layer 102 may be doped with doping atoms having a diffusivity less than a diffusivity of phosphorus within the semiconductor layer 102 at a temperature T=300K and standard atmospheric pressure. For example, a diffusivity of phosphorus in silicon at T=300K and standard atmospheric pressure is 10.5 cm$^2$/s. Thus, for a silicon-based semiconductor layer 102, the drift region 101 of the semiconductor layer 102 may be doped with doping atoms having a diffusivity less than 10.5 cm$^2$/s.

The semiconductor layer 102 may be doped with arsenic doping atoms (which may have a diffusivity of 0.06 cm$^2$/s in silicon), for example. Alternatively, the semiconductor layer 102 may be doped with antimony doping atoms (which may have a diffusivity of 3.9 cm$^2$/s in silicon), for example. Being doped with arsenic or antimony doping atoms refers to arsenic or antimony doping atoms being the majority doping atoms during the doping. For example, the average net doping concentration of the drift region of the semiconductor layer 102 is mainly caused by the arsenic (or antimony) doping atoms. For example, more than 70% (or e.g. more than 80%, or e.g. more than 90%, or e.g. more than 95%) of the doping atoms incorporated into the semiconductor layer 102 for causing the average net doping of the semiconductor layer 102 (or drift region 101) may be arsenic (or antimony) doping atoms.

The semiconductor substrate 103 may (also) be doped with doping atoms having a diffusivity less than a diffusivity of phosphorus within the semiconductor substrate 103 at a temperature T=300K and standard atmospheric pressure. For example, the semiconductor substrate 103 may be doped with arsenic doping atoms or antimony doping atoms. For example, more than 70% (or e.g. more than 80%, or e.g. more than 90%, or e.g. more than 95%) of the doping atoms incorporated into the semiconductor substrate 103 for causing the average net doping of the semiconductor substrate 103 may be arsenic (or antimony) doping atoms.

The semiconductor layer 102 and the semiconductor substrate 103 may be doped with the same doping atoms, for example. For example, the semiconductor layer 102 and the semiconductor substrate 103 may both be doped purely (or only) with arsenic doping atoms or alternatively only with antimony doping atoms.

The semiconductor substrate 103 may be a silicon-based semiconductor substrate (e.g. a silicon substrate) or a silicon carbide (SiC)-based semiconductor substrate). Alternatively, or optionally, the semiconductor substrate 103 may be a gallium arsenide (GaAs)-based semiconductor substrate, or a gallium nitride (GaN)-based semiconductor substrate, for example.

The semiconductor substrate 103 may have a minimum (or smallest) thickness of less than 200 μm (or e.g. less than 150 μm, or e.g. less than 100 μm, or e.g. less than 60 μm) measured in a substantially vertical direction.

The device structure of the semiconductor device 100 may be a power metal oxide semiconductor field effect transistor (MOSFET) structure, a power insulated gate bipolar transistor (IGBT) structure, or a power diode structure, for example. For example, each device structure may include a highly doped first source/drain or collector/emitter region having a second conductivity type (e.g. n++ doped), a body region having a second conductivity type (e.g. p-doped) and a drift region (e.g. n-doped). The first source/drain or collector/emitter region of the device structure, the body region of the device structure and the drift region of the device structure may be located adjacently to a gate (or gate trench structure), for example. The first source/drain region of the device structure, the body region of the device structure, the drift region of the device structure and the gate or gate trench structure may be located within the semiconductor layer 102.

A gate voltage applied to the gate (or gate trench structure) may induce a conductive channel (e.g. an n-channel) in the body region between the first source/drain region and the drift region. The conductive channel may be formed in a part of the body region adjacent to the gate (or gate trench structure), and a current flow may occur between the first source/drain region of the device structure and the drift region through the induced conductive channel, for example.

A (second) source/drain or collector/emitter region of the device structure may be arranged (or formed) in the semiconductor substrate 103 due to the doping of the semiconductor with doping atoms having a diffusivity less than phosphorus. A net (or average) doping concentration of the (second) source/drain or collector/emitter region arranged in the semiconductor substrate may be at least $1*10^{19}$ doping atoms per $cm^3$ (or e.g. at least $1*10^{19}$ doping atoms per $cm^3$), for example. The average doping concentration may be a measured number of dopant atoms per volume averaged over the (second) source/drain or collector/emitter region of the device structure, for example.

In the case of the device structure being a MOSFET structure, the drift region of the device structure may be located between (e.g. directly between or directly adjacently to) the body region of the device structure and the (second) source/drain region of the device structure. The (second) source/drain region of the device structure may be extend from the drift region 101 towards (or to) the second lateral side (e.g. a back side surface) of the semiconductor substrate 103 opposite to the first lateral side of the semiconductor substrate 103 on which the semiconductor layer 103 is formed. The source/drain region of the FET structure may have a second conductivity type (e.g. n++ doped), for example.

In the case of the device structure being an IGBT structure, the drift region of the device structure may be located between the body region of the device structure and an emitter/collector region of the device structure. The emitter/collector region of the device structure may be extend from the drift region towards (or to) a second lateral side (e.g. a back side surface) of the semiconductor substrate 103. The emitter/collector region of the device structure may have a second conductivity type (e.g. p+ doped).

Due to the presence of the sharp doping profiles and reduced out-diffusion of dopants, a field stop region located between the drift region and the emitter/collector region is not needed, for example. Thus, the drift region of the device structure may be located directly between (or directly adjacently to) the body region of the device structure and the (second) emitter/collector region of the device structure.

The first source/drain region of the device structure formed at a first lateral side of the semiconductor layer 102 may have an average doping concentration of more than $1 \times 10^{18}$ dopant atoms per $cm^3$ (or e.g. between $1 \times 10^{18}$ dopant atoms per $cm^3$ and $5 \times 10^{19}$ dopant atoms per $cm^3$). The average doping concentration may be a measured number of dopant atoms per volume averaged over a region of interest of the first source/drain region of the device structure, for example.

The body region of the device structure may have an average doping concentration of between $5*10^{16}$ dopant atoms per $cm^3$ and $1*10^{19}$ dopant atoms per $cm^3$ (or e.g. between $2*10^{17}$ dopant atoms per $cm^3$ and $1*10^{18}$ dopant atoms per $cm^3$). The average doping concentration may be a measured number of dopant atoms per volume averaged over a region of interest of the body region of the device, for example.

A region comprising the first conductivity type may be a p-doped region (e.g. caused by incorporating aluminum ions or boron ions) or an n-doped region (e.g. caused by incorporating nitrogen ions, phosphor ions or arsenic ions). Consequently, the second conductivity type indicates an opposite n-doped region or p-doped region. In other words, the first conductivity type may indicate a p-doping and the second conductivity type may indicate an n-doping or vice-versa.

The semiconductor device 100 may include a plurality of gate trenches extending (from a first (or front) side surface of the semiconductor layer 102) into the semiconductor layer 102. The plurality of gate trenches may extend vertically into the semiconductor layer such that a bottom of each gate trench may be located within or below the drift region e.g. within or below the mid-portion of the drift region), for example.

Each gate trench of the plurality of gate trenches may include at least one electrically conductive electrode and a gate oxide layer arranged within a trench structure. The gate oxide layer may be located adjacently to (e.g. encapsulating or surrounding) the at least one electrically conductive electrode. A (lateral) thickness of a portion of the gate oxide layer towards the bottom of the gate trench may be larger than a (lateral) thickness of a portion of the gate oxide layer towards the surface of the semiconductor layer.

Optionally, each gate trench may include more than one electrically conductive electrode (e.g. one, or two, or three or more electrically conductive electrodes). The electrically conductive electrodes (e.g. the first electrically conductive electrode and the second electrically electrode may be electrically insulated from each other by the gate oxide layer, for example. A (lateral) thickness of a portion of the gate oxide layer adjacent to (or surrounding) the second electrically conductive electrode (towards the bottom of the gate trench) may be larger than a (lateral) thickness of a portion of the gate oxide layer adjacent to (or surrounding) the first electrically conductive electrode.

Optionally or additionally, a lateral distance between neighboring gate trenches of the plurality of gate trenches may be 1.5 times or smaller than 1.5 times a lateral dimension (e.g. a width) of a gate trench of the plurality of gate trenches, for example. Alternatively or additionally, a lateral distance between neighboring gate trenches of the plurality of gate trenches may be between 2.5 times the thickness of the field oxide (adjacent to or surrounding the (lower) portion of the electrically conductive electrode towards the bottom of the gate trench) to 7.5 times the thickness of the field oxide, for example. The lateral dimension of each gate trench (and/or a lateral distance between neighboring gate trenches) may be based on an average of at least three gate trench lateral dimension values. For example, a first gate trench lateral dimension value may be a lateral dimension of the gate trench at a (vertical) gate trench depth of 20% from the first lateral surface of the semiconductor layer. A second gate trench lateral dimension value may be lateral dimension of the gate trench at a (vertical) gate trench depth of 50% from the first lateral surface of the semiconductor layer. A third gate trench lateral dimension value may be a lateral dimension of the gate trench at a (vertical) gate trench depth of 80% from the first lateral surface of the semiconductor layer.

The semiconductor device may be a power semiconductor device having a blocking voltage of at least 10 V. For example, the semiconductor device may have a breakdown voltage or blocking voltage of more than 10V (e.g. a breakdown voltage of 10V, 20V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example. A turn on-resistance of the semiconductor device may be less than 4 mΩmm² for a semiconductor device having a blocking voltage of 40V, for example.

A first lateral surface or front side surface of the semiconductor layer 102 may be a surface of the semiconductor layer 102 towards metal layers, insulation layers and/or passivation layers on top of the semiconductor layer 102 or a surface of one of these layers. For example, a semiconductor layer 102 front side may be the side at which active elements of the chip are formed. For example, in a power semiconductor chip, a chip front side may be a side of the chip at which a first source/drain region and a gate region are formed, and a chip back side may be a side of the chip at which a second source/drain region is formed. For example, more complex structures may be located at the chip front side than at the chip back side.

A lateral surface of the semiconductor layer 102 and/or semiconductor substrate 103 may be a substantially even plane e.g. neglecting unevenness of the semiconductor structure due to the manufacturing process and trenches). For example, the lateral dimension of the lateral surface of the semiconductor layer 102 or semiconductor substrate 103 may be more than 100 times larger (or more than 1000 times or more than 10000 times) than a maximal height of structures on the main surface. In comparison to a basically vertical edge (e.g. resulting from separating the substrate of the chip from others) of the semiconductor layer 102 or semiconductor substrate 103, the lateral surface may be a basically horizontal surface extending laterally. The lateral dimension of the lateral surface of the semiconductor layer 102 or semiconductor substrate 103 may be more than 100 times larger (or more than 1000 times or more than 10000 times) than a basically vertical edge of the semiconductor layer 102 or semiconductor substrate 103, for example.

Figure 1B:
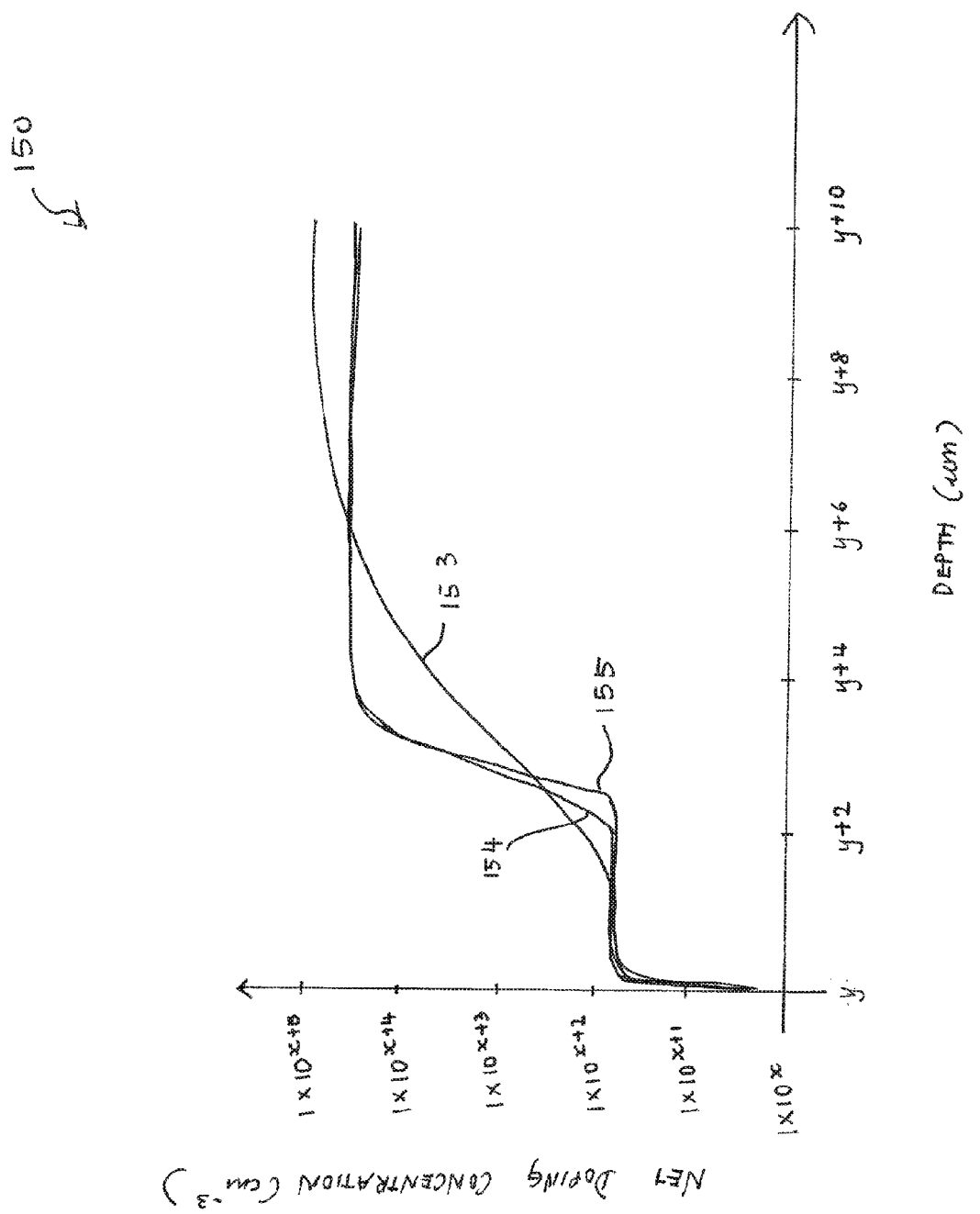

FIG. 1B shows a graphical illustration 150 of a variation of average net doping concentration (per cm³) 151 with respect to dopant depth (μm) 152 at a transition from a drift region to the semiconductor substrate for different semiconductor devices with different substrate doping combinations.

Line 153 represents an average net doping concentration with respect to dopant depth at the transition from the drift region to the semiconductor substrate for a semiconductor device in which both the drift region and the semiconductor substrate are doped purely with phosphorus doping atoms—in other words, if more than 70% (or e.g. more than 80%, or e.g. more than 90%, or e.g. more than 95%) of the doping atoms for causing the average net doping of the drift region are phosphorus doping atoms, and if more than 70% (or e.g. more than 80%, or e.g. more than 90%, or e.g. more than 95%) of the doping atoms for causing the average net doping of the semiconductor substrate are phosphorus doping atoms.

As shown by the gradual gradient of line 153 at the transition from the drift region to the semiconductor substrate, the doping concentration at the transition from the drift region to the semiconductor substrate varies between the first doping concentration value and the second doping concentration value over a distance of greater than 1 μm (or e.g. greater than 1.5 μm), for example. The gradient of line 153 is shallow throughout the transition from the drift region to the semiconductor substrate. For example, the transition from the drift region to the semiconductor substrate may be the transition between an average net doping concentration value within a middle 50% (or e.g. within a middle 40%, or e.g. within a middle 30%) of the drift region 101 to an average net doping concentration value within a middle 50% (or e.g. within a middle 40%, or e.g. within a middle 30%) of the semiconductor substrate 103. The doping concentration may vary from the average net doping concentration value within a middle 50% of the drift region 101 to the average net doping concentration value within a middle 50% of the semiconductor substrate 103 over a distance of greater than 5 μm (or e.g. greater than 6 μm, or greater than 8 μm), for example.

Line 154 represents an average net doping concentration with respect to dopant depth at the transition from the drift region to the semiconductor substrate of a semiconductor device in which the drift region is doped with phosphorus doping atoms and if the semiconductor layer 102 is doped with dopant atoms having a diffusivity less than phosphorus (e.g. arsenic doping atoms)—in other words, if more than 70% (or e.g. more than 80%, or e.g. more than 90%, or e.g. more than 95%) of the doping atoms for causing the average net doping of the drift region are phosphorus doping atoms, and if more than 70% (or e.g. more than 80%, or e.g. more than 90%, or e.g. more than 95%) of the doping atoms for causing the average net doping of the semiconductor substrate are arsenic doping atoms.

The doping concentration at the transition from the drift region to the semiconductor substrate varies between the first doping concentration value and the second doping concentration value over a distance of greater than 500 nm (or e.g. greater than 1 μm), for example. The gradient of line 154 shows that the doping concentration may vary from the average net doping concentration value within a middle 50% of the drift region 101 to the average net doping concentration value within a middle 50% of the semiconductor substrate 103 over a distance of greater than 1.5 μm (or e.g. greater than 2 μm), for example.

Line 155 represents an average net doping concentration with respect to dopant depth at the transition from the drift region to the semiconductor substrate of a semiconductor device in which the drift region is doped with doping atoms having a diffusivity less than phosphorus (e.g. arsenic doping atoms) and if the semiconductor layer 102 is doped with the same dopant atoms having a diffusivity less than phosphorus (e.g. arsenic doping atoms)—in other words, if more than 70% (or e.g. more than 80%, or e.g. more than 90%, or e.g. more than 95%) of the doping atoms for causing the average net doping of the drift region are arsenic doping atoms, and if more than 70% (or e.g. more than 80%, or e.g. more than 90%, or e.g. more than 95%) of the doping atoms for causing the average net doping of the semiconductor substrate are arsenic doping atoms.

Line 155 shows that the doping concentration at a transition from the drift region to the semiconductor substrate varies between a first doping concentration value and a second doping concentration value over a distance of less than 500 nm. The gradient of line 155 shows that the doping concentration may vary from the average net doping concentration value within a middle 50% of the drift region 101 to the average net doping concentration value within a middle 50% of the semiconductor substrate 103 over a distance of less than 1.5 μm, for example.

FIG. 1C shows a graphical illustration 160 of a variation of average net doping concentration (per cm³) 161 with respect to dopant depth (μm) 162 at a transition from the drift region to the semiconductor substrate. The graphical illustration 160 represents a magnified portion of the graphical illustration of FIG. 1B at a depth of between 1 μm to 4 μm.

The steepness of the tails may be obtained for lines 154 and lines 155.

As shown by line 154 (for a phosphorus doped semiconductor layer and an arsenic doped semiconductor substrate), the doping concentration at the transition from the drift region to the semiconductor substrate varies between the first doping concentration value A1 and the second doping concentration value A2 over a distance of more than 500 nm (or e.g. greater than 1 µm) for example. For line 154, the first doping concentration value A1 may be attained at a depth of 2.92 µm, for example, and the second doping concentration value A2 may be attained at a depth of 2.92 µm. Thus, a steepness of 650 nm per decade may be obtained.

As shown by line 155 (for a phosphorus doped semiconductor layer and an phosphorus doped semiconductor substrate), the doping concentration at the transition from the drift region to the semiconductor substrate varies between the first doping concentration value C1 and the second doping concentration value C2 over a distance of less than 500 nm (or e.g. less than 400 nm, or e.g. less than 300 nm), for example. For line 155, the first doping concentration value C1 may be attained at a depth of 3.29 µm, for example, and the second doping concentration value C2 may be attained at a depth of 3.62 µm. Thus, a steepness of 330 nm per decade may be obtained, which is almost double the steepness of line 154.

The first doping concentration value is an average net doping concentration of the mid-portion of the drift region 101 plus 20% (or e.g. plus 25%) of the average net doping concentration of the mid-portion of the drift region 101, for example. The second doping concentration value is an average net doping concentration of the mid-portion of the drift region plus one decade. Alternatively or optionally, the first doping concentration value (initial value of the tail) may be a concentration in the epitaxial semiconductor layer at the floor or bottom of the gate trench plus 20%. The second doping concentration value (final value of the tail) may be a concentration in the epitaxial semiconductor layer at the floor or bottom of the gate trench plus one decade.

The various examples describe a device structure (e.g. a transistor or diode cell), which has a steep out-diffusion dopant tail in the semiconductor substrate, and a steep dopant tail for the epitaxial semiconductor layer in the direction of the substrate towards the drain. Although the out-diffusion tail of the epitaxial semiconductor layer in the depth towards the drain may have been previously regarded as being negligible and covered by the semiconductor substrate out-diffusion tail, the various examples herein show that the profile gradient (of the epitaxial semiconductor layer) is important for the optimization (or improvement) of Ron*A.

By using doping atoms with low diffusivity for doping the semiconductor substrate 103 and the semiconductor layer 102, low out-diffusion (e.g. preferably steep tails) may be obtained. As shown, a very steep net concentration profile gradient of at least 330 nm per decade may be obtained directly wider the trench floor. The steepness of the tail may be determined by a difference between a first doping concentration value and a second doping concentration value.

FIGS. 1B and 1C show the average net doping profile of the semiconductor substrate and the doping of the epitaxial semiconductor layer at the end of the (doping) processes. The various examples provide concepts for new generation power MOSFETs which are optimized with respect to costs and which may achieve a low Ron*A with avalanche robustness. Optimal steep doping gradients between the semiconductor substrate level and the epitaxial semiconductor layer level may be achieved. Up until now, approaches to highly doped substrates with phosphorus have been applied. Although, the highest possible doping is preferred, strong out-diffusion of phosphor and the flat and wide diffusions tail are undesirable, especially with thinner chips (having a thickness of less than 60 µm). For example, the transition from the semiconductor substrates doping tails and the epitaxial semiconductor layer are more smeared if phosphorus is used as a dopant in the epitaxial semiconductor layer, as they lead to an undesirable Ron*A in transistors. Relatively strong diffusing dopants are therefore undesirable in the semiconductor substrate and in the device epitaxial semiconductor layer.

FIG. 2A shows a schematic illustration of a power semiconductor device 200 according to an embodiment.

The power semiconductor device 200 comprises an epitaxial semiconductor layer 102 located adjacently to a semiconductor substrate 103. The epitaxial semiconductor layer 102 is doped with doping atoms having a diffusivity less than phosphorus in the epitaxial semiconductor layer 102. The semiconductor substrate 103 is doped with doping atoms having diffusivity less than phosphorus in the semiconductor substrate 103.

Due to the epitaxial semiconductor layer 102 being doped with doping atoms having a diffusivity less than phosphorus and the semiconductor substrate 103 being doped with doping atoms having diffusivity less than phosphorus, sharp doping profiles in a transition from the epitaxial semiconductor layer to the semiconductor substrate may be obtained, leading to a turn-on resistance of the semiconductor device being reduced and/or avalanche robustness being improved.

The power semiconductor device 200 may be similar to the semiconductor device described in connection with FIGS. 1A to 1C.

The epitaxial semiconductor layer 102 may be doped with doping atoms having a diffusivity less than a diffusivity of phosphorus (e.g. less than 10.5 $cm^2/s$) within the semiconductor layer 102 at a temperature T=300K and standard atmospheric pressure. The semiconductor layer 102 may be doped with arsenic doping atoms or antimony doping atoms, for example.

The semiconductor substrate 103 may be doped with doping atoms having a diffusivity less than a diffusivity of phosphorus within the semiconductor substrate 103 at a temperature T=300K and standard atmospheric pressure. For example, the semiconductor substrate may be doped with arsenic doping atoms or antimony doping atoms. The epitaxial semiconductor layer 102 and the semiconductor substrate 103 may be doped with the same doping atoms. For example, the semiconductor layer 102 and the semiconductor substrate 103 may both be doped with arsenic doping atoms to achieve their respective average net doping concentrations.

The power semiconductor device may have a blocking voltage of at least 10 V. For example, the power semiconductor device may have a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

Figure 2B:
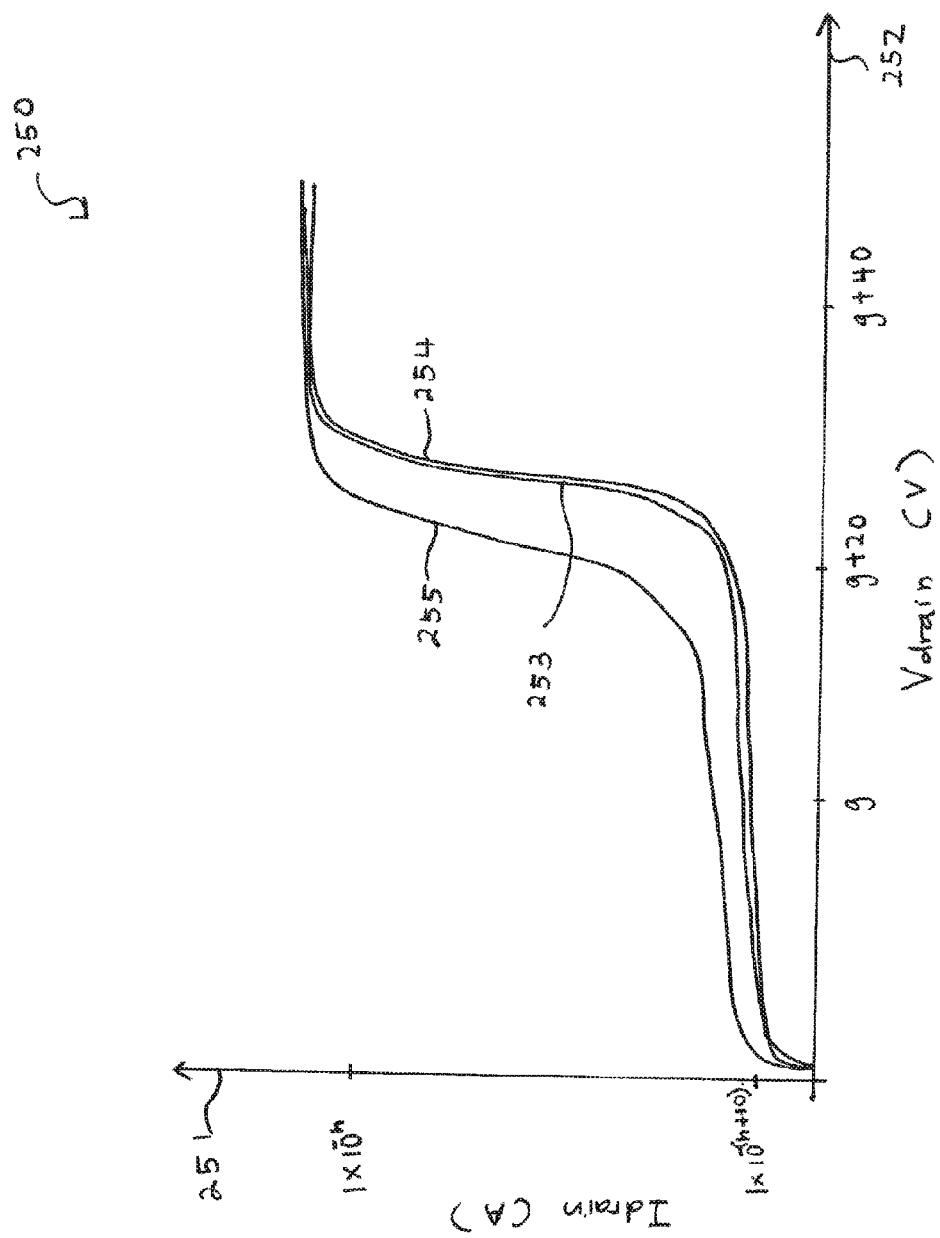
FIG. 2B shows a graphical illustration of drain current (A) versus drain voltage (V) for semiconductor devices having different doping characteristics.

FIG. 2B shows a graphical illustration 250 of drain current (A) 251 versus drain voltage (V) 252 characteristics (break through characteristics) for different semiconductor devices with different substrate-epitaxial doping configurations.

Line 253 represents a drain current-drain voltage curve for a semiconductor device having both the drift region and the semiconductor substrate doped with phosphorus doping atoms. A turn on voltage for such a semiconductor device may be 46 V with a semiconductor layer thickness of 7.6 μm.

Line 254 represents a drain current-drain voltage curve for a semiconductor device having a drift region (or semiconductor layer) doped with phosphorus doping atoms and the semiconductor substrate doped with arsenic doping atoms. A turn on voltage for such a semiconductor device may be 47 V with a semiconductor layer thickness of 4.2 μm.

Line 255 represents a drain current-drain voltage curve for a semiconductor device having adrift region (or semiconductor layer) doped with arsenic doping atoms and the semiconductor substrate doped with arsenic doping atoms. A turn on voltage for such a semiconductor device may be 44.5 V with a semiconductor layer thickness of 3.7 μm.

Line 255 shows that for a power semiconductor device 200 having an epitaxial semiconductor layer 102 and a semiconductor substrate 103 both being doped with doping atoms having a diffusivity less than phosphorus, improved turn on performance of the power semiconductor device 200 may be achieved.

Figure 2C:
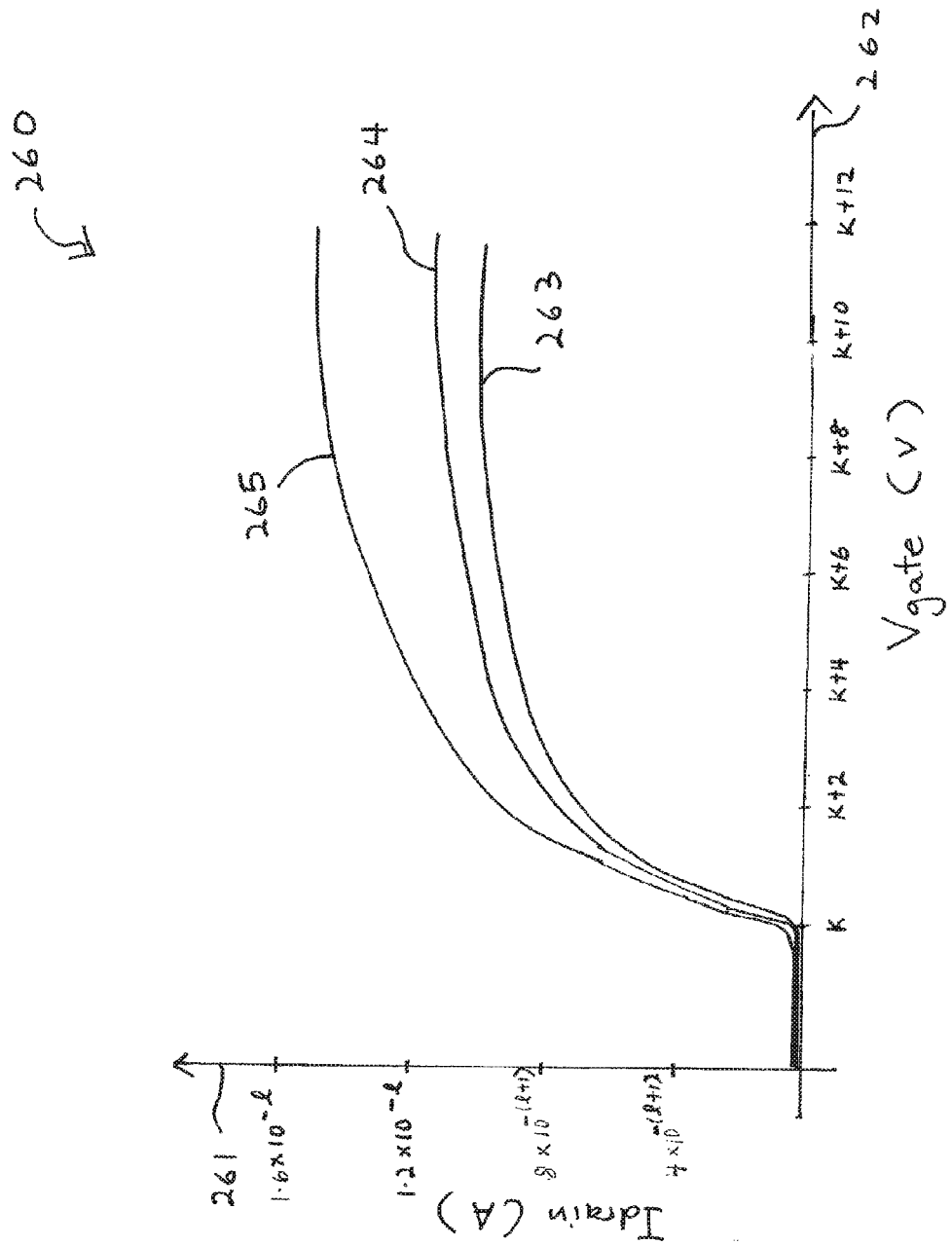
FIG. 2C shows a graphical illustration of drain current (A) versus gate voltage (V) for semiconductor devices having different doping characteristics.

FIG. 2C shows a graphical illustration 260 of transfer characteristics (of drain current (A) 261 versus gate voltage (V) 262 for different semiconductor devices.

Line 263 represents a drain current-gate voltage curve for a semiconductor device having both the drift region and the semiconductor substrate doped with phosphorus doping atoms. A turn on-resistance (Ron×A) of the semiconductor device may be 6 mΩmm$^2$ with a semiconductor layer thickness of 7.2 μm.

Line 264 represents a drain current-drain voltage curve for a semiconductor device having a drift region (or semiconductor layer) doped with phosphorus doping atoms and the semiconductor substrate doped with arsenic doping atoms. A turn on-resistance (Ron×A) of the semiconductor device may be 5.5 mΩmm$^2$ with a semiconductor layer thickness of 4.2 μm.

Line 265 represents a drain current-drain voltage curve for a semiconductor device having a drift region (or semiconductor layer) doped (purely) with arsenic doping atoms and the semiconductor substrate doped (purely) with arsenic doping atoms. A turn on-resistance of the semiconductor device may be 4 mΩmm$^2$ with a semiconductor layer thickness of 3.7 μm.

Due to the steepness of the arsenic doped semiconductor substrate and arsenic doped semiconductor layer, an optimization of Ron*A at a constant break down voltage of more than 40V may be achieved. Through the steep profile, it is possible to achieve Ron optimization through the reduction of the epitaxial semiconductor layer thickness alone and thus a reduction of the high resistance portion of the cell. Simulations data of the devices show that particularly, a Ron*A reduction may be obtained from 5.1 mΩmm$^2$ to 3.99 mΩmm$^2$ in the case of a 40V power MOS transistor, for example.

More details and aspects are mentioned in connection with the embodiments described above or below. The embodiments shown in FIGS. 2A to 2C may comprise one or more optional additional features corresponding to one or more aspects mentioned in connection with the proposed concept or one or more embodiments described above (e.g. FIGS. 1A to 1C) or below (FIGS. 3A to 4).

Figure 3A:
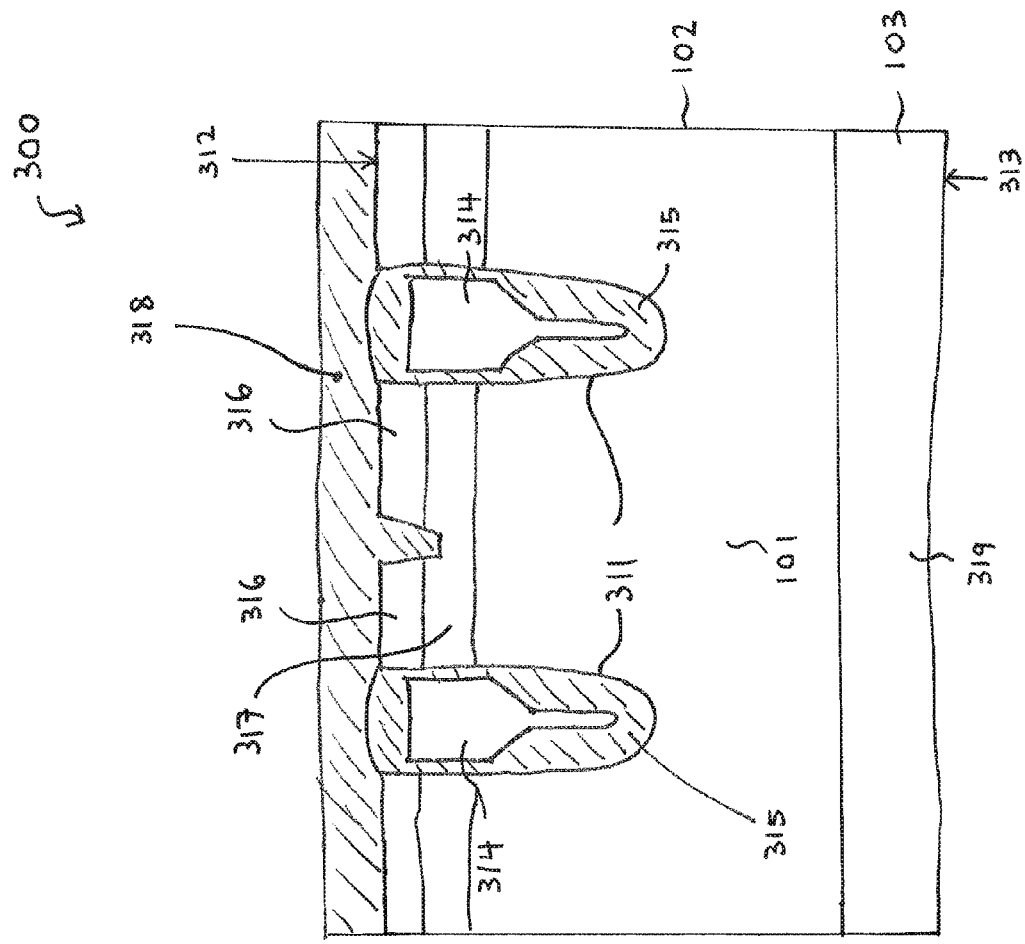
FIG. 3A shows a schematic illustration of a semiconductor device with a plurality of gate trenches.
Figure 4:
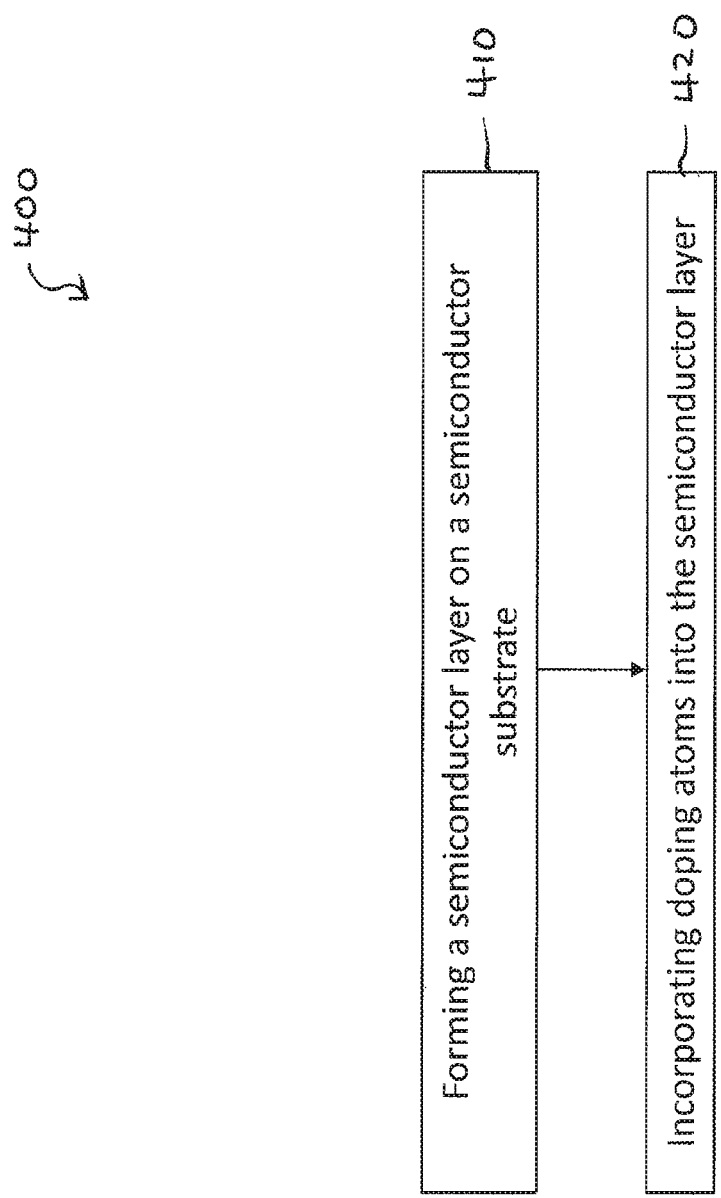
FIG. 4 shows a flow chart of a further method for forming a semiconductor device.

FIG. 3A shows a schematic illustration of a semiconductor device 300 according to an embodiment. The semiconductor device 300 may be similar to the semiconductor devices described in connection with FIGS. 1A to 1C and 2A to 2C.

The semiconductor device 300 may include a plurality of gate trenches 311 extending into the semiconductor layer 102 from a first (front) side surface 312 of the semiconductor layer 102. Each gate trench 311 of the plurality of gate trenches 311 may include at least one electrically conductive electrode 314 and a gate oxide layer 315 located adjacently to the at least one electrically conductive electrode 314.

Each gate trench structure 311 may be located adjacently to a first source/drain region 316 of a device structure, a body region 317 of the device structure and a drift region 101 of the device structure, for example. A first source/drain contact structure 318 may be arranged at the first side surface 312 of the semiconductor layer 102. The first source/drain contact structure 318 may include one or more electrically conductive layers (e.g. metallization layers and/or barrier layers) ohmically connected to the first source/drain region 316 8 (and/or the body region 317) of the device structure.

A bottom of each gate trench 311 may be located within (or below) the drift region 101 (e.g. within the mid-portion of the drift region 101), for example. For example, the gate trench 311 may extend to a vertical depth within the semiconductor layer 102, such that a bottom of the gate trench 311 may be located within (or below) the middle 50% of the drift region 101, for example.

A (lateral) thickness of a portion of the gate oxide layer 315 towards the bottom of the gate trench 311 may be larger than a (lateral) thickness of a portion of the gate oxide layer 315 towards the (front side) surface 312 of the semiconductor layer 102. For example, the gate trench 311 may be formed according to a field plate trench concept. A thinner gate oxide (e.g. having a thickness of less than 5 nm) may be formed adjacently to the electrically conductive electrode 314 at a (upper) portion of the electrically conductive electrode 314 towards the (front side) surface 312 of the semiconductor layer 102. A thicker field oxide may be formed adjacently to the electrically conductive electrode 314 at a (lower) portion of the electrically conductive electrode 314 nearer towards the bottom of the gate trench 311 than the (upper) portion. The (lower) portion of the electrically conductive electrode 314 may have a smaller lateral dimension than the (upper) portion of the electrically conductive electrode 314.

The (second) source/drain or collector/emitter region 319 of the device structure may be arranged (or formed) in the semiconductor substrate 103 due to the average net doping of the semiconductor substrate 103. A second source/drain contact structure may be ohmically connected to the second source/drain region 319 of the device structure at the opposite second (back side) side surface of the semiconductor substrate 103, for example.

Optionally or additionally, a lateral distance between (or separating) neighboring gate trenches 311 of the plurality of gate trenches 311 may be 1.5 times (or smaller than 1.5 times a smallest lateral dimension (e.g. a width) of a gate trench 311 of the plurality of gate trenches 311, for example. Alternatively or additionally, a lateral distance between neighboring gate trenches 311 of the plurality of gate trenches 311 may be between 2.5 times the minimum thickness of the field oxide (adjacent to or surrounding the (lower) portion of the electrically conductive electrode 314 towards the bottom of the gate trench 311) to 7.5 times the minimum thickness of the field oxide, for example. The maximum thickness of the field oxide may be the smallest thickness of the field oxide measured from the at least one electrode 314 to a drift region surrounding the gate trench, for example.

More details and aspects are mentioned in connection with the embodiments described above or below. The embodiments shown in FIG. 3A may comprise one or more optional additional features corresponding to one or more aspects mentioned in connection with the proposed concept or one or more embodiments described above (e.g. FIGS. 1A to 2C) or below (FIGS. 3B to 4).

Figure 3B:
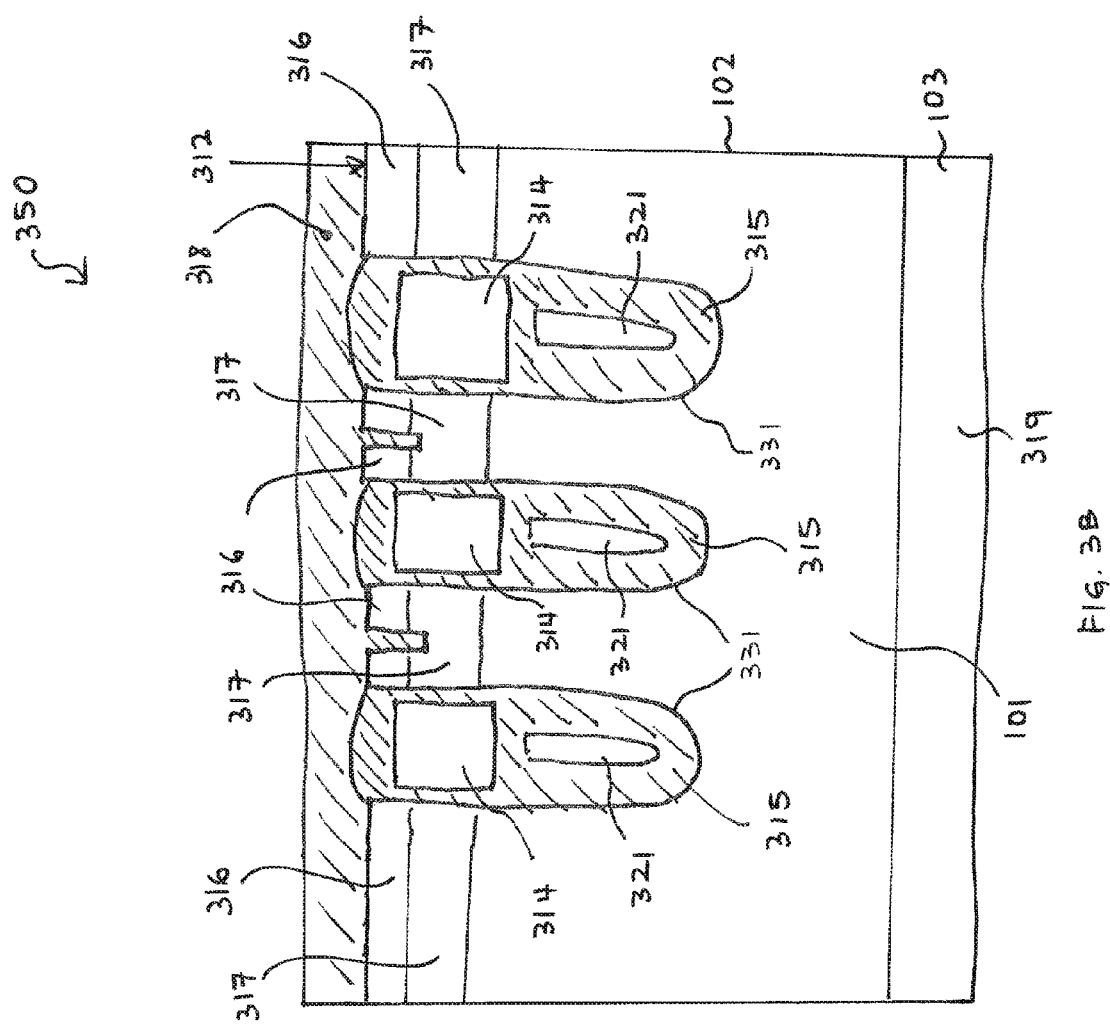
FIG. 3B shows a schematic illustration of a semiconductor device with a dense arrangement of a plurality of gate trenches.

FIG. 3B shows a schematic illustration of a semiconductor device 350 according to an embodiment. The semiconductor device 350 may be similar to the semiconductor device described in connection with FIG. 3A.

Each gate trench 331 of the plurality of gate trenches 331 may include a first electrically conductive electrode 314 and a second electrically electrode 321. The first electrically conductive electrode 314 may be located nearer towards the front side surface 312 of the semiconductor layer 102 (e.g. at an upper portion of the gate trench 331) than the second electrically electrode 321, for example. The second electrically conductive electrode 321 may be located nearer towards the bottom of the gate trench 331 than the first electrically conductive electrode 314, for example. Optionally, each gate trench 331 may include more than one electrically conductive electrode (e.g. one, or two, or three or more electrically conductive electrodes) which may be spaced vertically with respect to each other in the trench structure. The electrically conductive electrodes (e.g. the first electrically conductive electrode 314 and the second electrically electrode 321) may be electrically insulated from each other by the gate oxide layer 315, for example.

The gate oxide layer 315 may be located adjacently to the first electrically conductive electrode 314 and the second electrically conductive electrode 321. A (lateral) thickness of a portion of the gate oxide layer 315 adjacent to the second electrically conductive electrode 321 (towards the bottom of the gate trench 311) may be larger than a (lateral) thickness of a portion of the gate oxide layer 315 adjacent to the first electrically conductive electrode 314 (towards the front side surface 312 of the semiconductor layer 102). For example, a thinner gate oxide may be formed adjacently to the first electrically conductive electrode 314. A thicker field oxide may be formed adjacently to the second electrically conductive electrode 321. The second electrically conductive electrode 321 may have a smaller lateral dimension than the first electrically conductive electrode 314, for example.

A gate voltage (or potential) applied to the first electrically conductive electrode 314 (gate electrode) of the gate trench 331 may induce a conductive channel (e.g. an n-channel) in the body region 317 between the first source/drain region 316 and the drift region 101. A source voltage (or potential) may be applied to the second electrically conductive electrode 321 (a field electrode). As a result, a gate to drain capacitance may be reduced, and replaced by a source to drain capacitance. Thus, agate charge for switching the transistor may be reduced, and thus switching losses may be reduced.

The plurality of gate trenches 331 may be more dense than the plurality of gate trenches described in connection with FIG. 3A. For example, a lateral distance between neighboring gate trenches 331 of the plurality of gate trenches 331 may be 1.5 times (or smaller than 1.5 times) a smallest lateral dimension (e.g. a width) of a gate trench 331 of the plurality of gate trenches 331. Alternatively or additionally, a lateral distance between neighboring gate trenches 331 of the plurality of gate trenches 331 may be between 2.5 times the minimum thickness of the field oxide (adjacent to or surrounding the second electrically conductive electrode 314) to 7.5 times the minimum thickness of the field oxide, for example.

More details and aspects are mentioned in connection with the embodiments described above or below. The embodiments shown in FIG. 3B may comprise one or more optional additional features corresponding to one or more aspects mentioned in connection with the proposed concept or one or more embodiments described above e.g. FIGS. 1A to 3A) or below (FIG. 4).

FIG. 4 shows a flow Chart of a method 400 for forming a semiconductor device.

The method 400 comprises forming 410 a semiconductor layer on a semiconductor substrate. The semiconductor substrate comprises a doping of doping atoms having a diffusivity less than a diffusivity of phosphorus.

The method 400 further comprises incorporating 420 doping atoms having a diffusivity less than a diffusivity of phosphorus into the semiconductor layer to form a drift region of a device structure in the semiconductor layer during or after the of the forming semiconductor layer.

Due to the semiconductor layer being doped with doping atoms having a diffusivity less than phosphorus and the semiconductor substrate being doped with doping atoms having diffusivity less than phosphorus, sharp doping profiles in a transition from the semiconductor layer to the semiconductor substrate may be obtained, leading to a turn-on resistance of the semiconductor device being reduced and/or avalanche robustness being improved.

The method 400 may include forming 410 (e.g. growing) the semiconductor layer epitaxially on a surface of the semiconductor substrate.

The method 400 may include incorporating the doping atoms (e.g. by ion implantation) to (bulk) dope the semiconductor substrate with arsenic or antimony doping atoms, such that a source/drain or collector/emitter region is formed in the semiconductor substrate before the forming 410 of the semiconductor layer on the surface of the semiconductor substrate. The method 400 may further include co-implanting fluorine atoms into the semiconductor substrate during (or after) the incorporating of the doping atoms into the semiconductor substrate to form the source/drain or collector/emitter region. The incorporating of the doping atoms and the co-implanting of fluorine atoms may be carried such that a net (or average) doping concentration of the (second) source/drain or collector/emitter region arranged in the semiconductor substrate caused by the incorporating of the doping atoms may be at least $1*10^{19}$ doping atoms per $cm^3$ (or e.g. at least $1*10^{19}$ doping atoms per $cm^3$), for example.

The method 400 may include incorporating 420 the doping atoms (e.g. by ion implantation) having a diffusivity less than a diffusivity of phosphorus (e.g. arsenic or antimony doping atoms) into the epitaxial semiconductor layer after incorporating the doping atoms into the semiconductor substrate, such that a drift region is formed in the semiconductor layer. The method 400 may further include co-implanting fluorine atoms into the semiconductor layer during or after incorporating the doping atoms into the semiconductor layer to form the drift region. The incorporating of the doping atoms and the co-implanting of fluorine atoms may be carried such that a net (or average) doping concentration value of a mid-portion of the drift region caused by the incorporating of the doping atoms may be at least $1*10^{16}$ doping atoms per $cm^3$ (or e.g. at least $1*10^{17}$ doping atoms per $cm^3$, or e.g. may lie between $1*10^{16}$ doping atoms per $cm^3$ and $1*10^{17}$ doping atoms per $cm^3$).

The co-implanting with fluorine atoms may reduce the out-diffusion of the doping atoms in the semiconductor substrate and the semiconductor layer, such that a doping concentration at a transition from a drift region of the semiconductor layer to the semiconductor substrate varies between a first doping concentration value and a second doping concentration value over a distance of less than 500 nm. The first doping concentration value may be an average net doping concentration of a mid-portion of the drift region plus 20% of the average net doping concentration of the mid-portion of the drift region, for example. The mid-portion of the drift region 101 lies within a middle 50% of the drift region 101, for example.

The method 400 may further include forming a body region and a source/drain or emitter/collector region in the semiconductor layer after forming the drift region in the semiconductor layer.

The method 400 may further include forming a plurality of gate trenches in the semiconductor layer after forming the body region and the source/drain or emitter/collector region in the semiconductor layer, for example.

More details and aspects are mentioned in connection with the embodiments described above or below. The embodiments shown in FIG. 4 may comprise one or more optional additional features corresponding to one or more aspects mentioned in connection with the proposed concept or one or more embodiments described above (e.g. FIGS. 1A to 3B) or below.

Various examples relate to a concept for power MOSFETs with steep epitaxial and substrate tails. Various examples relate to an optimal very steep doping profile gradient in the transition area between device epitaxial semiconductor layer and semiconductor substrate doping. Various examples relate to semiconductor device having a doping concentration which varies by less than 500 nm per decade at a transition from the drift region to the semiconductor substrate.

Aspects and features (e.g. the semiconductor substrate, the semiconductor layer, the drift region, the first doping concentration value, the second doping concentration value, the average net doping concentration, the plurality of gate trenches, the first source/drain or emitter/collector region, the second source/drain or emitter/collector region, the body region, the drift region, the gate oxide and the field oxide) mentioned in connection with one or more specific examples may be combined with one or more of the other examples.

Figure 5:
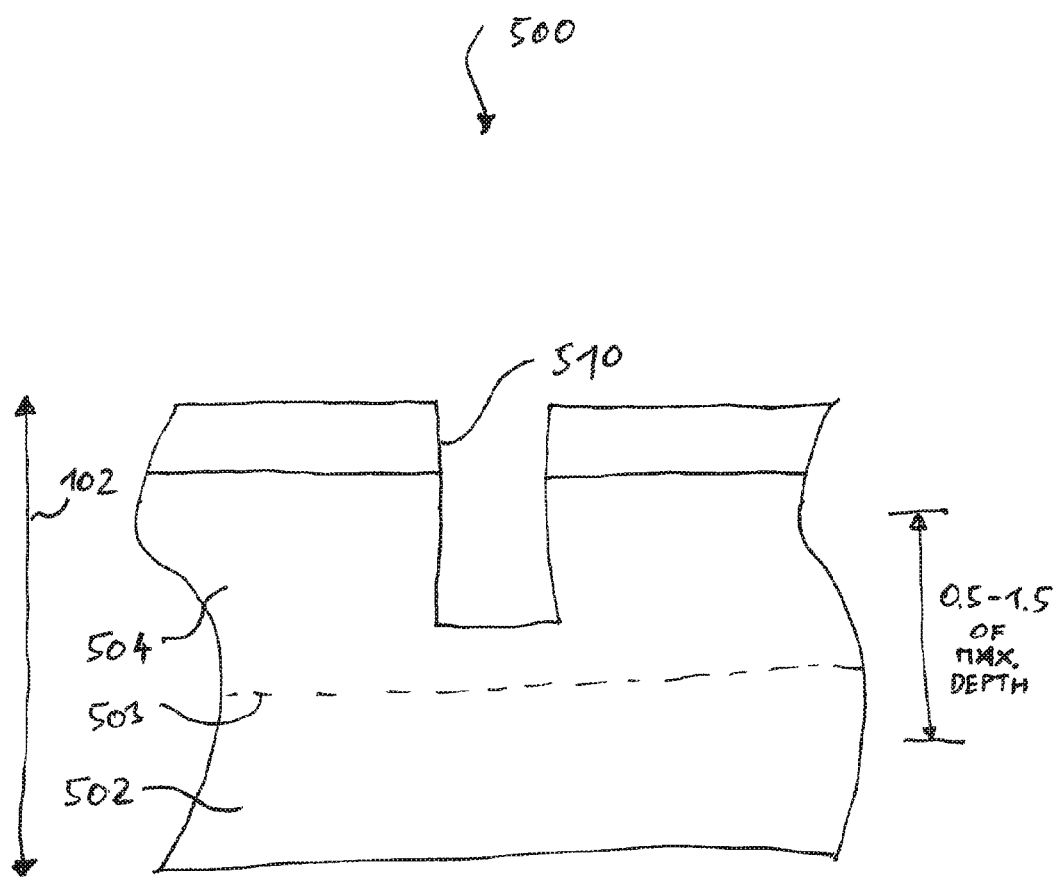
FIG. 5 shows a schematic illustration of a semiconductor device.

FIG. 5 shows a schematic cross section of a semiconductor device according to an embodiment. The semiconductor device 500 including a drift region of a device structure arranged in a semiconductor layer 102. The drift region includes at least one first drift region portion 502 adjacent to at least one second drift region portion 504. A majority of dopants within the first drift region portion 502 are a first species of dopants. The first species of dopants have a diffusivity less than a diffusivity of phosphor within the semiconductor layer 102. Further, a majority of dopants within the second drift region portion 504 are a second species of dopants. Additionally, the semiconductor device 500 includes a trench 510 extending from a surface of the semiconductor layer 102 into the semiconductor layer 102. A vertical distance between the surface of the semiconductor layer 102 and a border 503 between the first drift region portion 502 and the second drift region portion 504 is larger than 0.5 times a maximal depth of the trench and less than 1.5 times the maximal depth of the trench 510.

By using different species of dopants for a region of the drift region located at a depth of the trench and a region below or at the bottom of the trench, a segregation of dopants with low diffusivity adjacent to the trench or an upper part of the trench may be avoided or reduced, while a low diffusion of dopants towards a backside of the device may be obtained due to the usage of dopants with low diffusivity at a part of the drift region located closer to the backside. For example, a turn-on resistance of the semiconductor device may be reduced and/or avalanche robustness of the semiconductor device may be improved due to the implementation of the first drift region portion while a disturbance of structures in proximity of the trench may be avoided or reduced due to a low lateral variation of the doping concentration within the drift region in proximity of the trench due to the implementation of the second drift region portion.

The majority of dopants within the first drift region portion 502 are atoms of the first species of dopants, which may mean that a number of dopants of the first species is larger than a number of dopants of any other single species of dopants (e.g. the second species of dopants) within the first drift region portion 502 and/or is larger than a total number of all dopants different from the first species (e.g. resulting from impurities or diffusion into the first drift region portion) within the first drift region portion 502. For example, the first species of dopants may be arsenic atoms or antimony atoms.

The majority of dopants within the second drift region portion 504 are atoms of the second species of dopants, which may mean that a number of dopants of the second species is larger than a number of dopants of any other single species of dopants (e.g. the first species of dopants) within the second drift region portion 504 and/or is larger than a total number of all dopants different from the second species (e.g. resulting from impurities or diffusion into the second drift region portion) within the second drift region portion 504. For example, the second species of dopants may be phosphor atoms or hydrogen related donors (e.g. caused by incorporated hydrogen ions).

For example, the first species of dopants and the second species of dopants are dopants of the first conductivity type. For example, the first species of dopants and the second species of dopants are donors and the drift region is an n-doping region.

The border 503 between the first drift region portion 502 and the second drift region portion 504 may be an area comprising a number of dopants of the first species equal to a number of dopants of the second species. The border 503 may extend substantially in parallel to a surface of the front side surface of the of the semiconductor layer (e.g. even plane although trenches may extend from the surface into the semiconductor layer) within the whole semiconductor die or at least in proximity of the one or more trenches. For example, the vertical distance between the border 503 and the surface of the semiconductor layer is larger than 0.5 times (or larger than 0.6 or larger than 0.7) a maximal depth of the trench and less than 1.5 times (or less than 1.4 or less than 1.3) the maximal depth of the trench, for example, at least within a lateral area comprising a lateral distance to the trench 510 of less than 10 µm (or less than 50 For example, the vertical distance from the border 503 between the first drift region portion 502 and the second drift region portion 504 to the surface of the semiconductor layer is larger than the maximal depth of the trench 510.

The trench 510 may be formed by forming a structured mask layer on the surface of the semiconductor layer 102 (e.g. front side surface of the semiconductor die of the semiconductor device) and etching the semiconductor layer 102 at regions uncovered by the mask layer. The trench 510 may be one of a plurality of trenches etched simultaneously. For example, the trench 510 may be a field electrode trench with a field electrode (e.g. connected or connectable to a source potential or a gate potential) located within the field electrode trench or a gate trench with a gate electrode (e.g. electrical connected a gate wiring structure of the semiconductor device) located within the gate trench.

The first drift region portion may be a first sub layer semiconductor layer 102 (e.g. epitaxially grown or implemented by implanting the first species of dopants) and the second drift region portion may be a second sub layer (e.g. epitaxially grown or implemented by implanting the second species of dopants) of the semiconductor layer 102. For example, a plurality of trenches may extend into the semiconductor layer and the first drift region portion may be a common drift region portions extending laterally below the plurality of trenches, while a second drift region portion of a plurality of second drift region portions is located between every two neighboring trenches. For example, a maximal doping concentration within the first drift region portion and/or the second drift region portion of the drift region is less than $1*10^{18}$ doping atoms per $cm^3$ (or less than $5*10^{17}$ or less than $1*10^{17}$). For example, an average net doping concentration value of the drift region may be at least $1*10^{16}$ doping atoms per $cm^3$ at least $1*10^{15}$, at least $5*10^{15}$, at least $5*10^{16}$ or at least $1*10^{17}$). For example, a vertical extension of the first drift region portion 502 is larger than 1 µm (or larger than 5 µm or larger than 10 µm). The vertical extension of the first drift region portion 502 may depend on the voltage class of the semiconductor device 500.

For example, a local minimum of the net doping concentration of the drift region may be located at the border 503 between the first drift region portion 502 and the second drift region portion 504. The local minimum may be caused by a diffusion of the dopants of the second species into the first drift region portion 502 at the border 503. The net doping concentration at the local minimum may be lower than 90% of an average net doping concentration of the first drift region portion 502 or the second drift region portion 503. Optionally, an additional implantation of dopants (e.g. of the first or second or another species) may be performed to compensate the local minimum.

Optionally, the semiconductor device 500 may further comprise a semiconductor substrate located adjacently to the semiconductor layer 102. A doping concentration of the semiconductor substrate may be significantly higher than an average doping concentration of the drift region (e.g. of the first drift region portion and the second drift region portion). For example, a doping concentration at a transition from the drift region to the semiconductor substrate may vary between a first doping concentration value and a second doping concentration value over a distance of less than 500 nm (e.g. may increase from the first doping concentration value to the second doping concentration value). The first doping concentration value may be an average net doping concentration of a mid-portion of the drift region plus 20% of the average net doping concentration of the mid-portion of the drift region. The mid-portion of the drift region may lie within a middle 50% of a vertical dimension of the drift region. Further, the second doping concentration value may be an average net doping concentration of the mid-portion of the drift region plus one decade.

For example, the doping concentration at the transition from the drift region to the semiconductor substrate may increase from the first doping concentration value to the second doping concentration value over a distance of more than 100 nm. Although a very steep increase may be desired, at least some slope will exist due to diffusion of dopants, for example.

The device structure of the semiconductor device 500 may be a transistor structure (e.g. metal oxide semiconductor field effect transistor (MOSFET) structure or insulated gate bipolar transistor (IGBT) structure) or a diode structure, for example. For example, device structure may be a transistor cell of a transistor arrangement comprising a plurality of equal or similar transistor cells. A transistor cell of the transistor arrangement may comprise at least a source region, a body region and a gate (e.g. a lateral gate at a front side surface of the semiconductor substrate or a trench gate located within a gate trench extending into the semiconductor substrate), for example. Further, the transistor cells of the plurality of transistor cells of the transistor arrangement may share a common (mutual) drift region and/or a common drain region (e.g. the transistor cells are MOSFET cells) or a common collector region (e.g. the transistor cells are IGBT cells). For example, the device structure may comprise at least one body region located adjacent to the at least one second drift region portion 502.

For example, the device structure may comprise a breakdown voltage of more than 10V. For example, the semiconductor device 100 may be a power semiconductor device. A power semiconductor device, an electrical structure (e.g. transistor structure or diode structure) of the power semiconductor device or the device structure may have a breakdown voltage or blocking voltage of more than 10V (e.g. a breakdown voltage of 10V, 20V or 50V), more than 100V (e.g. a breakdown voltage of 200V, 300V, 400V or 500V), more than 500V (e.g. a breakdown voltage of 600V, 700V, 800V or 1000V) or more than 1.000V (e.g. a breakdown voltage of 1200V, 1500V, 1700V, 2000V, 3300V or 6500V).

The semiconductor layer 102 and/or the semiconductor substrate may be a silicon layer or substrate. Alternatively, the semiconductor layer 102 and/or the semiconductor substrate may be a wide band gap semiconductor layer or substrate having a band gap larger than the band gap of silicon (1.1 eV). For example, the semiconductor layer 102 and/or the semiconductor substrate may be a silicon carbide (SiC)-based semiconductor layer or substrate, or a gallium arsenide (GaAs)-based semiconductor layer or substrate, or a gallium nitride (GaN)-based semiconductor layer or substrate. Further, the semiconductor layer 102 and/or the semiconductor substrate may be a semiconductor wafer or a semiconductor die.

For example, a lateral direction or lateral dimensions may be measured in parallel to a front side surface of the semiconductor layer 102 and/or the semiconductor substrate and a vertical direction or vertical dimensions may be measured orthogonal to the front side surface of the semiconductor layer 102 and/or the semiconductor substrate. For example, the surface of the semiconductor layer 102 is a front side surface layer of the semiconductor die of the semiconductor device 500. The front side or front side surface of the semiconductor layer 102 may be an interface towards a wiring layer stack of the semiconductor device (e.g. comprising wiring structures and insulation layers). The front side or front side surface of the semiconductor layer 102 or the semiconductor die may be the side used to implement more sophisticated and complex structures than at the backside of the semiconductor substrate 110, since the process parameters (e.g. temperature) and the handling may be limited for the backside, if structures are already formed at one side of the semiconductor substrate 110, for example.

For example, the drift region of the devices described in connection with one or more of the semiconductor devices shown in FIG. 1A-4 may comprise a first drift region portion 502 and a second drift region portion 504 as described in connection with the semiconductor device shown in FIG. 5.

Figure 7:
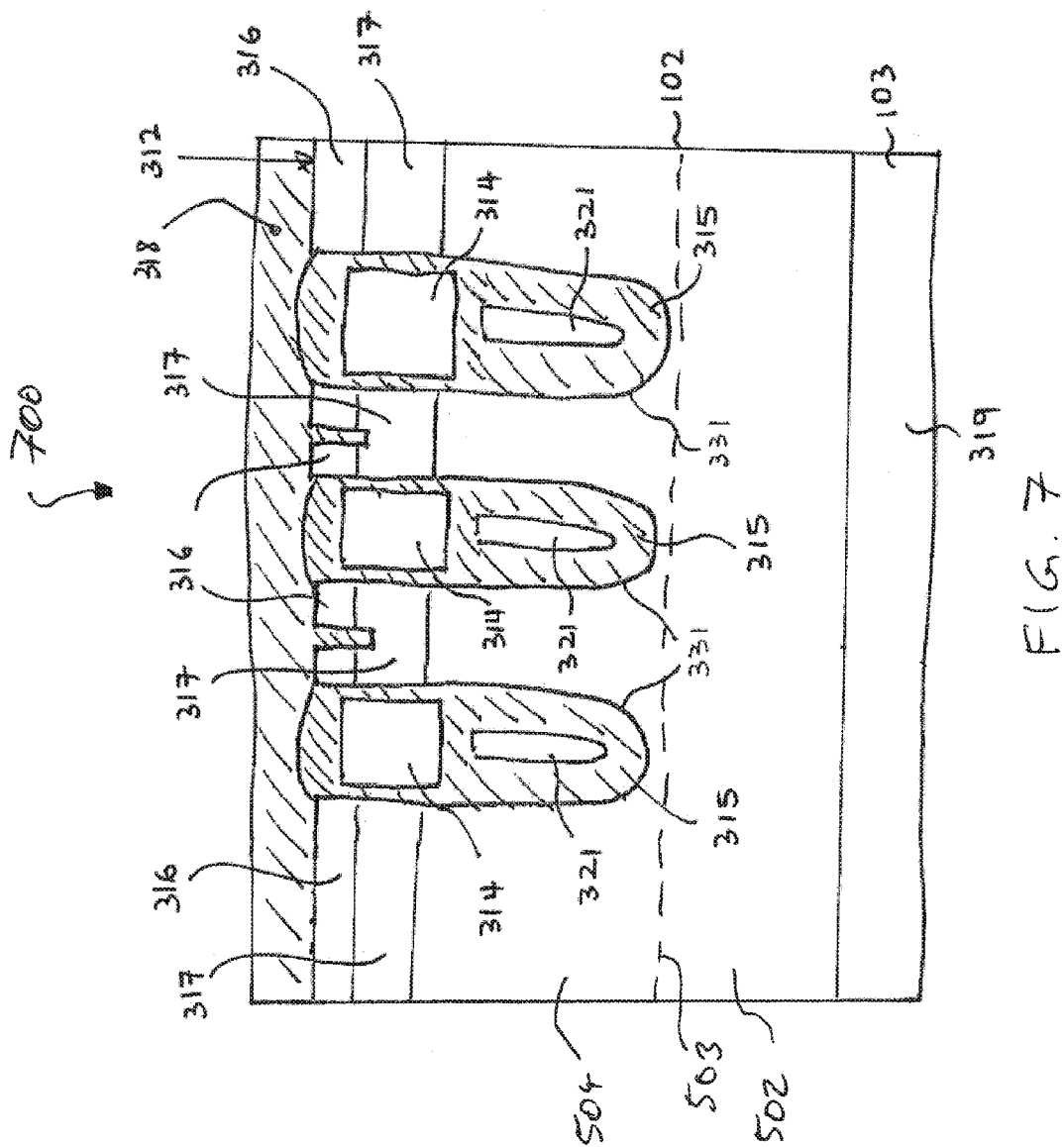
FIG. 7 shows a schematic illustration of another semiconductor device with a gate electrode and afield electrode in a gate trench.
Figure 8:
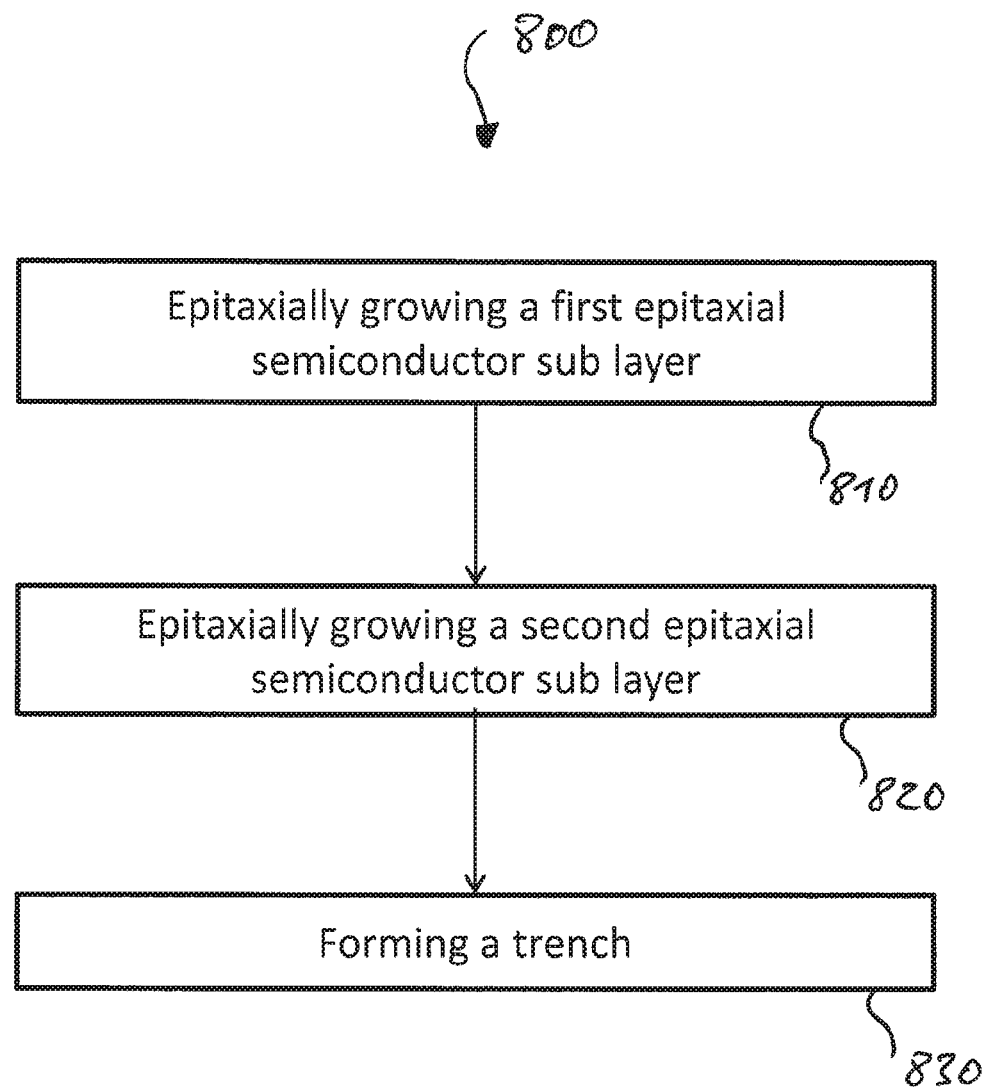
FIG. 8 shows a flow chart of a method for forming a semiconductor device.

More details and aspects are mentioned in connection with the embodiments described above or below. The embodiments shown in FIG. 5 may comprise one or more optional additional features corresponding to one or more aspects mentioned in connection with the proposed concept or one or more embodiments described above (e.g. FIGS. 1A to 4) or below (FIGS. 6-8).

Figure 6:
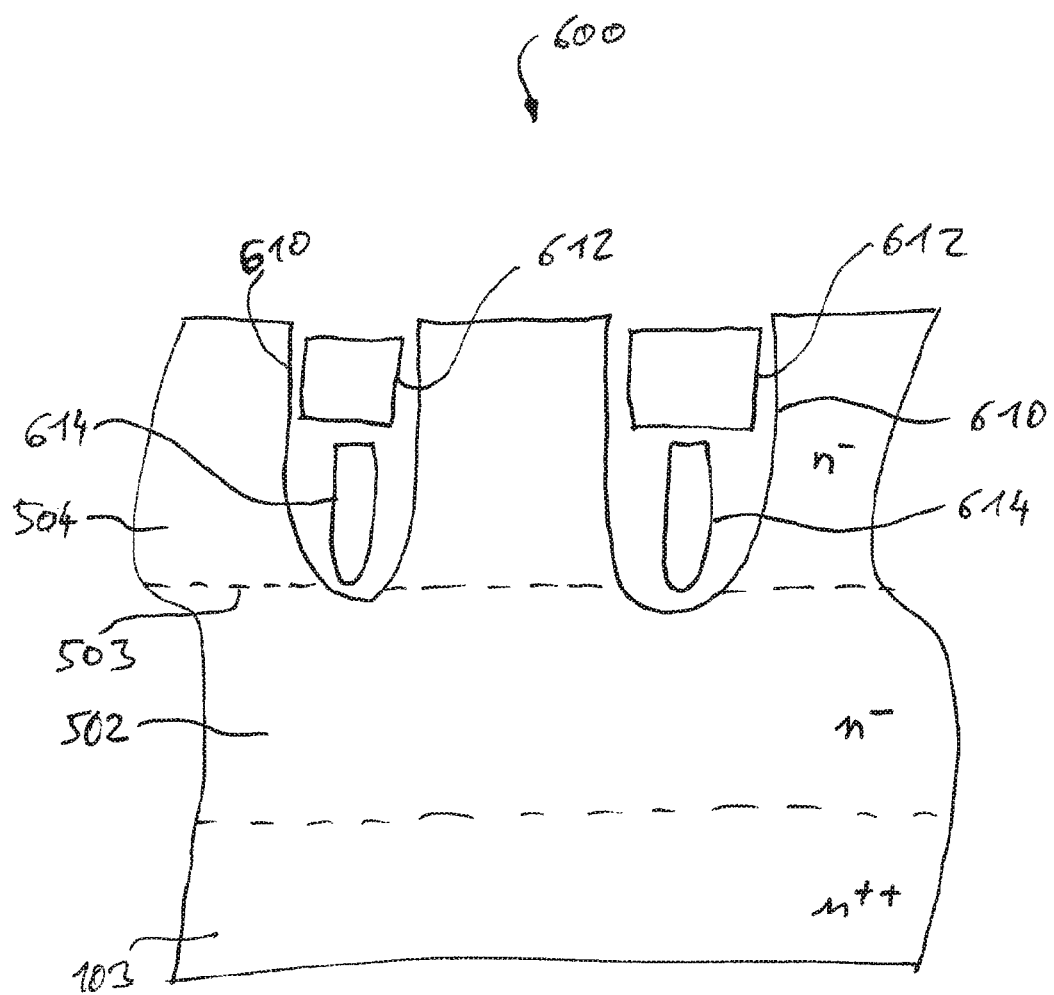
FIG. 6 shows a schematic illustration of a semiconductor device with a gate electrode and a field electrode in a gate trench.

FIG. 6 shows a schematic illustration of a semiconductor device with a gate electrode and a field electrode in a gate trench according to an embodiment. The implementation of the semiconductor device 600 may be similar to the implementation described in connection with FIG. 5. The semiconductor device 600 comprises a plurality of gate trenches 610 comprising a gate electrode 612 and a field electrode 614 in each gate trench 610. The gate electrodes 612 are electrically connected to a gate wiring structure e.g. comprising agate pad and optionally a gate ring). The field electrodes 614 are electrically connected to a source wiring structure or wiring structure connectable to another defined potential. The gate electrodes 612 are insulated from the field electrodes 614 at least within the gate trenches. A thickness of the insulation layer between a semiconductor material of the semiconductor layer and the field electrode 614 is larger than (e.g. larger than 2 times) a thickness of the insulation layer between a semiconductor material of the semiconductor layer and the gate electrode 612. The first drift doping region portion 502 is located vertically between the second drift doping region portion 504 and the semiconductor substrate 103. The border 503 between the first drift region portion 502 and the second drift region portion 504 is located in proximity of the bottom of the trenches. For example, the vertical distance of the border 503 between the first drift region portion 502 and the second drift region portion 504 and the surface of the semiconductor layer is larger than 0.8 times a maximal depth of the trench and less than the maximal depth of the trench.

FIG. 6 may show an example with a two step epi (epitaxial growth). The concentrations of the individual layers may be selected to be equal or may also be individually optimized.

Optionally, the thicknesses of the multilevel epi layers are variable in broader ranges. The bottom layer thickness may be at least as thick as the outdiffusion from the substrate, the top epi layer may be about as thick as the field oxide FOX trench depth, for example.

In the channel region of the trench transistor, optionally a further epi layer with again changed dopants may be deposited. For example, a p-doped layer may be grown (e.g. comprising boron atoms as dopants) to implement a body region of a transistor structure or an anode region of a diode structure.

Optionally, between the epi layers, for further optimizing of the dopant profile, implantations of any species may be introduced which may be activated by a subsequent tempering.

More details and aspects are mentioned in connection with the embodiments described above or below. The embodiments shown in FIG. 6 may comprise one or more optional additional features corresponding to one or more aspects mentioned in connection with the proposed concept or one or more embodiments described above (e.g. FIGS. 1A to 5) or below (FIGS. 7-8).

FIG. 7 shows a schematic illustration of a semiconductor device with a gate electrode and a field electrode in a gate trench according to an embodiment. The implementation of the semiconductor device 700 may be similar to the implementation described in connection with FIG. 3B. However, the semiconductor layer comprises a first drift doping portion 502 and a second drift doping portion 504. A border 503 between the first drift region portion 502 and the second drift region portion 504 is located below (larger distance to surface of semiconductor layer) the bottom of the gate trenches. For example, a vertical distance between a bottom of the gate trenches (e.g. maximal depth of trenches) and the border 503 is less than 1 µm.

More details and aspects are mentioned in connection with the embodiments described above or below. The embodiments shown in FIG. 7 may comprise one or more optional additional features corresponding to one or more aspects mentioned in connection with the proposed concept or one or more embodiments described above (e.g. FIGS. 1A to 6) or below (FIG. 8).

FIG. 8 shows a flow chart of a method for forming a semiconductor device according to an embodiment. The method 800 comprises epitaxially growing 810 a first epitaxial semiconductor sub layer of a semiconductor layer. A majority of dopants within the first epitaxial semiconductor sub layer are a first species of dopants having a diffusivity less than a diffusivity of phosphor within the semiconductor layer. Further, the method 800 comprises epitaxially growing 820 a second epitaxial semiconductor sub layer of a semiconductor layer after forming the first epitaxial semiconductor sub layer majority of dopants within the second epitaxial semiconductor sub layer are a second species of dopants. Additionally, the method 800 comprises forming 830 a trench extending from a surface of the semiconductor layer into the semiconductor layer. A vertical distance between a border between the first epitaxial semiconductor sub layer and the second epitaxial semiconductor sub layer and the surface of the semiconductor layer is larger than 0.5 times a maximal depth of the trench and less than 1.5 times the maximal depth of the trench.

By using different species of dopants for different sub layers, a segregation of dopants with low diffusivity adjacent to the trench or an upper part of the trench may be avoided or reduced, while a low diffusion of dopants towards a backside of the device may be obtained due to the usage of dopants with low diffusivity at a sub layer located closer to the backside.

The first epitaxial semiconductor sub layer may be formed on a surface of a semiconductor substrate (e.g. highly doped).

For example, the first epitaxial semiconductor sub layer and second epitaxial semiconductor sub layer comprise the same conductivity type and the first species of dopants and the second species of dopants are dopants of a first conductivity type.

The semiconductor layer may comprise further epitaxial sub layers (e.g. a body doping region sub layer comprising a second conductivity type).

For example, the surface of the semiconductor layer is a front side surface layer of the semiconductor die of the semiconductor device to be formed.

The method 800 may further comprise forming (e.g. by thermal oxidation) an insulation layer within the trench and/or forming a trench electrode (e.g. gate electrode or field electrode) within the trench.

More details and aspects are mentioned in connection with the embodiments described above or below. The embodiments shown in FIG. 8 may comprise one or more optional additional features corresponding to one or more aspects mentioned in connection with the proposed concept or one or more embodiments described above (e.g. FIGS. 1A to 7) or below.

Some embodiments relate to Power MOSFETs with steep Epi-und substrate-tails.

An epitaxy of pure arsenic in combination with processes showing a strong arsenic segregation like e.g. trench transistors comprising a thick thermal trench bottom oxide may be difficult since a major proportion of the arsenic concentration may remain close to the trench side wall surface and may have a negative effect on the breakdown parameters of the field plate. A strong enrichment at the FOX interface for the arsenic epi may occur.

Utilizing the good characteristics of an arsenic epitaxy and the very steep transition towards the arsenic substrate in the bottom portion of the transistor cell may be proposed by including a first (thinner) arsenic doped epitaxy layer followed by a phosphorous doped second epitaxy layer which may be basically as thick as the targeted trench depth. In this way, it may be guaranteed that in the complete trench depth area phosphorous is the only dopant (or major dopant) and thus the good characteristics of phosphorous segregation and again an outdiffusion in the region of the trenches may occur. For example, a 40V power transistor may comprise a trench depth of approx. 2 µm and the overall thickness of the epitaxy layer required for blocking 40V may be approx. 3.5 µm. From this, an n++ doped arsenic substrate followed by an arsenic doped 1.5 µm thick epitaxy layer 1 again followed by a phosphorous doped 2.0 µm thick epitaxy layer 2 may be implemented.

For example, using a multilevel epitaxy layer with different dopants for preventing unfavorable segregation effects in the direct trench (bottom) area with a simultaneously optimized steep substrate epi tail may be proposed.

The doping profile and used species of dopants may be measured by secondary ion mass spectrometry SIMS, for example.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device, comprising:
   a drift region of a device structure arranged in a semiconductor layer, wherein the drift region comprises at least one first drift region portion and at least one second drift region portion, wherein a majority of dopants within the at least one first drift region portion are a first species of dopants having a diffusivity less than a diffusivity of phosphor within the semiconductor layer, wherein a majority of dopants within the at least one second drift region portion are a second species of dopants; and
   a trench extending from a surface of the semiconductor layer into the semiconductor layer, wherein a vertical distance between the surface of the semiconductor layer and a border between the at least one first drift region portion and the at least one second drift region portion is larger than 0.5 times a maximal depth of the trench and less than 1.5 times the maximal depth of the trench, wherein the at least one second drift region portion is located between the surface of the semiconductor layer and the at least one first drift region portion.

2. The semiconductor device of claim 1, wherein the device structure is a transistor structure and the trench is a gate trench of the transistor structure, and wherein a gate electrode of the transistor structure is located within the gate trench.

3. The semiconductor device of claim 1, further comprising a body region of the device structure, wherein the body region is located adjacent to the at least one second drift region portion.

4. The semiconductor device of claim 1, wherein a maximal doping concentration within the at least one first drift region portion and the at least one second drift region portion of the drift region is less than $1*10^{18}$ doping atoms per $cm^3$.

5. The semiconductor device of claim 1, wherein an average net doping concentration value of the drift region is at least $1*10^{16}$ doping atoms per $cm^3$.

6. The semiconductor device of claim 1, wherein a local minimum of a net doping concentration of the drift region is located at the border between the at least one first drift region portion and the at least one second drift region portion.

7. The semiconductor device of claim 1, wherein the vertical distance between the surface of the semiconductor layer and the border between the at least one first drift region portion and the at least one second drift region portion is larger than the maximal depth of the trench.

8. The semiconductor device of claim 1, wherein the second species of doping atoms is phosphor.

9. The semiconductor device of claim 1, wherein a vertical extension of the at least one first drift region portion is larger than 1 μm.

10. The semiconductor device of claim 1, further comprising a semiconductor substrate located adjacent to the semiconductor layer, wherein a doping concentration at a transition from the drift region to the semiconductor substrate varies between a first doping concentration value and a second doping concentration value over a distance of less than 500 nm, wherein the first doping concentration value is an average net doping concentration of a mid-portion of the drift region plus 20% of the average net doping concentration of the mid-portion of the drift region, wherein the mid-portion of the drift region lies within a middle 50% of a vertical dimension of the drift region, and wherein the second doping concentration value is an average net doping concentration of the mid-portion of the drift region plus one decade.

11. The semiconductor device of claim 10, wherein the doping concentration at the transition from the drift region to the semiconductor substrate increases from the first doping concentration value to the second doping concentration value over a distance of more than 100 nm.

12. The semiconductor device of claim 10, wherein the semiconductor substrate is doped with doping atoms having a diffusivity less than a diffusivity of phosphor within the semiconductor substrate.

13. The semiconductor device of claim 10, wherein the semiconductor layer and the semiconductor substrate are doped with the same doping atoms.

14. The semiconductor device of claim 10, wherein an average net doping concentration of a source or collector region arranged in the semiconductor substrate is at least $1*10^{19}$ doping atoms per $cm^3$.

15. The semiconductor device of claim 1, wherein the semiconductor layer has a thickness of less than 8 μm.

16. The semiconductor device of claim 1, wherein the semiconductor layer is an epitaxially grown semiconductor layer.

17. The semiconductor device of claim 1, wherein the device structure of the semiconductor device comprises a breakdown voltage of at least 10 V.

18. A semiconductor device, comprising:
a drift region of a device structure arranged in a semiconductor layer located adjacently to a semiconductor substrate,
wherein a doping concentration at a transition from the drift region to the semiconductor substrate varies between a first doping concentration value and a second doping concentration value over a distance of less than 500 nm,
wherein the first doping concentration value is an average net doping concentration of a mid-portion of the drift region plus 20% of the average net doping concentration of the mid-portion of the drift region,
wherein the mid-portion of the drift region lies within a middle 50% of a vertical dimension of the drift region,
wherein the second doping concentration value is an average net doping concentration of the mid-portion of the drift region plus one decade.

19. The semiconductor device of claim 18, wherein the doping concentration at the transition from the drift region to the semiconductor substrate increases from the first doping concentration value to the second doping concentration value over a distance of more than 100 nm.

20. The semiconductor device of claim 18, wherein the semiconductor substrate is doped with doping atoms having a diffusivity less than a diffusivity of phosphor within the semiconductor substrate.

21. The semiconductor device of claim 18, wherein the semiconductor layer and the semiconductor substrate are doped with the same doping atoms.

22. The semiconductor device of claim 18, wherein an average net doping concentration of a source or collector region arranged in the semiconductor substrate is at least $1*10^{19}$ doping atoms per $cm^3$.

23. A method for forming a semiconductor device, the method comprising:
epitaxially growing a first epitaxial semiconductor sub layer of a semiconductor layer on a semiconductor substrate, wherein a majority of dopants within the first epitaxial semiconductor sub layer are a first species of dopants having a diffusivity less than a diffusivity of phosphor within the semiconductor layer;
epitaxially growing a second epitaxial semiconductor sub layer of a semiconductor layer after forming the first epitaxial semiconductor sub layer, wherein a majority of dopants within the second epitaxial semiconductor sub layer are a second species of dopants; and
forming a trench extending from a surface of the semiconductor layer into the semiconductor layer, wherein a vertical distance of a border between the first epitaxial semiconductor sub layer and the second epitaxial semiconductor sub layer to the surface of the semiconductor layer is larger than 0.5 times a maximal depth of the trench and less than 1.5 times the maximal depth of the trench.

* * * * *